US 9,036,438 B2

(12) United States Patent
Hemink et al.

(10) Patent No.: US 9,036,438 B2
(45) Date of Patent: *May 19, 2015

(54) NON-VOLATILE STORAGE WITH TEMPERATURE COMPENSATION BASED ON NEIGHBOR STATE INFORMATION

(75) Inventors: Gerrit Jan Hemink, Yokohama (JP); Shinji Sato, Chigasaki (JP)

(73) Assignee: SANDISK TECHNOLOGIES INC., Plano, TX (US)

( * ) Notice: Subject to any disclaimer, the term of this patent is extended or adjusted under 35 U.S.C. 154(b) by 223 days.

This patent is subject to a terminal disclaimer.

(21) Appl. No.: 13/486,305

(22) Filed: Jun. 1, 2012

(65) Prior Publication Data
US 2012/0236670 A1    Sep. 20, 2012

Related U.S. Application Data

(63) Continuation of application No. 12/708,699, filed on Feb. 19, 2010, now Pat. No. 8,213,255.

(51) Int. Cl.
*G11C 7/04* (2006.01)
*G11C 11/56* (2006.01)

(52) U.S. Cl.
CPC .............. *G11C 11/5642* (2013.01); *G11C 7/04* (2013.01)

(58) Field of Classification Search
CPC ........................................................ G11C 7/04
USPC .................... 365/211, 185.18, 185.24, 185.28
See application file for complete search history.

(56) References Cited

U.S. PATENT DOCUMENTS

| 5,867,429 | A | 2/1999 | Chen et al. |
| 6,522,580 | B2 | 2/2003 | Chen et al. |
| 6,560,152 | B1 | 5/2003 | Cernea |
| 7,057,958 | B2 | 6/2006 | So et al. |
| 7,391,650 | B2 | 6/2008 | Mokhlesi et al. |
| 7,463,528 | B2 * | 12/2008 | Mokhlesi et al. ........ 365/185.22 |
| 7,518,923 | B2 | 4/2009 | Mokhlesi |
| 7,583,535 | B2 | 9/2009 | Sekar et al. |
| 7,755,946 | B2 | 7/2010 | Dunga et al. |

(Continued)

FOREIGN PATENT DOCUMENTS

WO    WO2010002752    1/2010

OTHER PUBLICATIONS

Response to Written Opinion dated Apr. 8, 2013, European Patent Application No. 11703807.5.

(Continued)

*Primary Examiner* — Vu Le
(74) *Attorney, Agent, or Firm* — Vierra Magen Marcus LLP

(57) ABSTRACT

Data is programmed into and read from a set of target memory cells. When reading the data, temperature compensation is provided. The temperature compensation is based on temperature information and the state of one or more neighbor memory cells. In one embodiment, when data is read from set of target memory cells, the system senses the current temperature and determines the differences in temperature between the current temperature and the temperature at the time the data was programmed. If the difference in temperature is greater than a threshold, then the process of reading the data includes providing temperature compensation based on temperature information and neighbor state information. In one alternative, the decision to provide the temperature compensation can be triggered by conditions other than a temperature differential.

10 Claims, 16 Drawing Sheets

(56) References Cited

U.S. PATENT DOCUMENTS

| | | | |
|---|---|---|---|
| 7,808,831 B2* | 10/2010 | Mokhlesi et al. | 365/185.21 |
| 7,876,620 B2* | 1/2011 | Mokhlesi et al. | 365/185.21 |
| 2005/0013165 A1 | 1/2005 | Ban | |
| 2008/0239833 A1 | 10/2008 | Nirschl et al. | |
| 2008/0244338 A1 | 10/2008 | Mokhlesi et al. | |
| 2008/0247253 A1 | 10/2008 | Nguyen et al. | |
| 2008/0250300 A1 | 10/2008 | Mokhlesi et al. | |
| 2009/0080259 A1 | 3/2009 | Alrod et al. | |
| 2009/0091979 A1 | 4/2009 | Shalvi | |
| 2010/0088575 A1 | 4/2010 | Sharon et al. | |
| 2010/0172187 A1 | 7/2010 | Dunga et al. | |
| 2011/0205823 A1 | 8/2011 | Hemink | |

OTHER PUBLICATIONS

Notice of Allowance dated Mar. 1, 2012, U.S. Appl. No. 12/708,699, filed Feb. 19, 2010.

PCT International Search Report dated Apr. 5, 2011, PCT Patent Application No. PCT/US2011/024287.

PCT Written Opinion of the International Searching Authority dated Apr. 5, 2011, PCT Patent Application No. PCT/US2011/024287.

Japanese Office Action dated Apr. 30, 2014, Japanese Patent Application No. 2012-553939.

U.S. Appl. No. 14/290,930, filed May 29, 2014.

Preliminary Amendment dated May 29, 2014, U.S. Appl. No. 14/290,930.

Response to Japanese Office Action dated Aug. 7, 2014, Japanese Patent Application No. 2012-553939.

Decision of Rejection dated Sep. 2, 2014, Japanese Patent Application No. 2012-553939.

Office Action dated Dec. 18, 2014, U.S. Appl. No. 14/290,930.

Response to Japanese Office Action dated Dec. 9, 2014, Japanese Patent Application No. 2012-553939.

Chinese Office Action dated Dec. 31, 2014, Chinese Patent Application No. 201180020070.8.

* cited by examiner

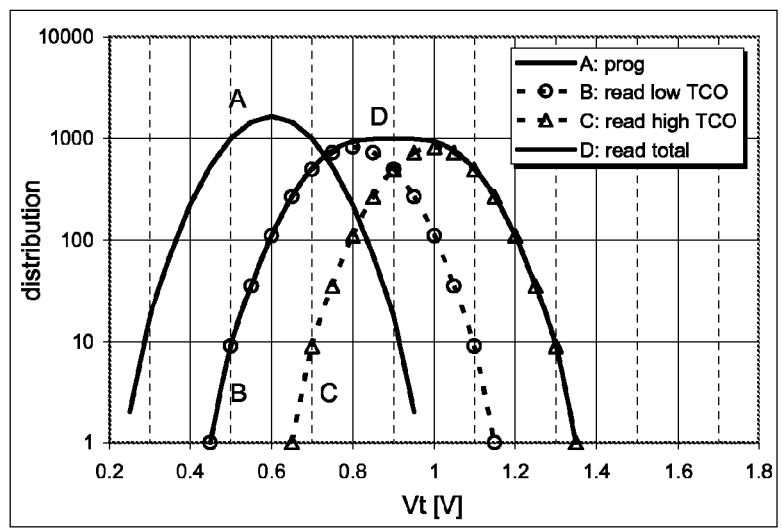
Fig. 1A
Fig. 1
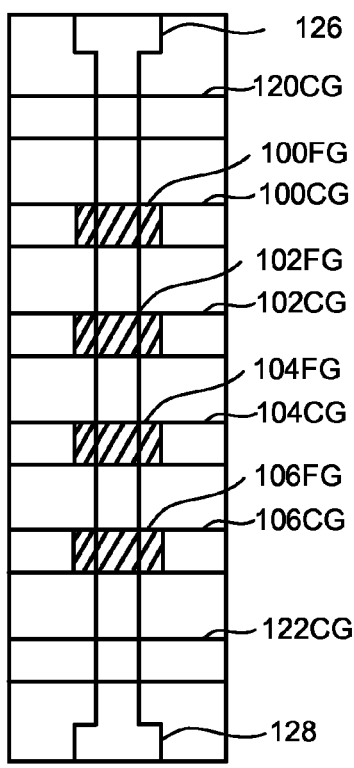
Fig. 2
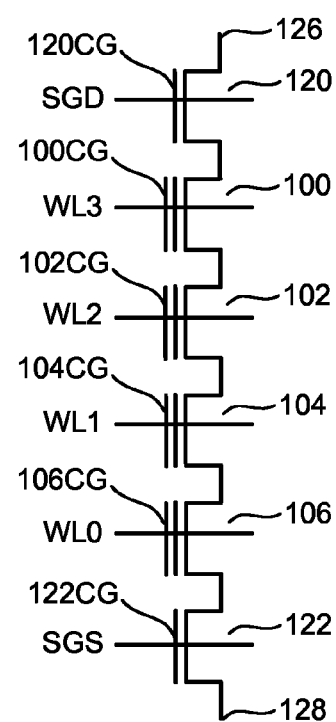

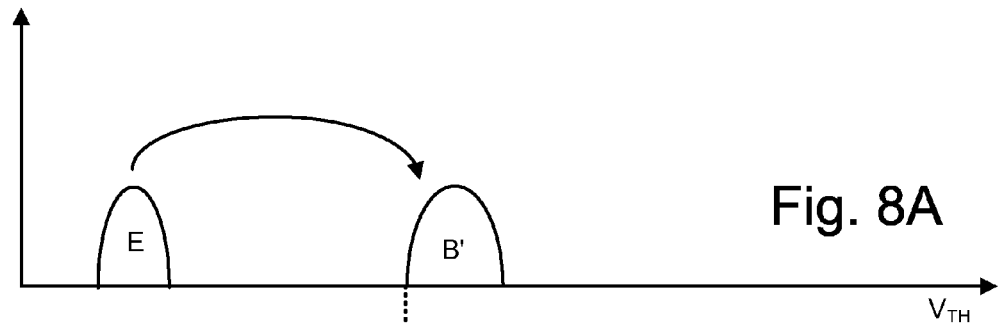
Fig. 8A
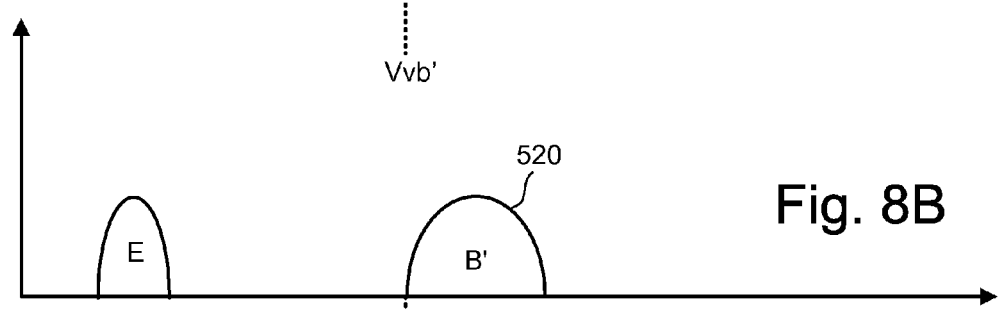
Fig. 8B
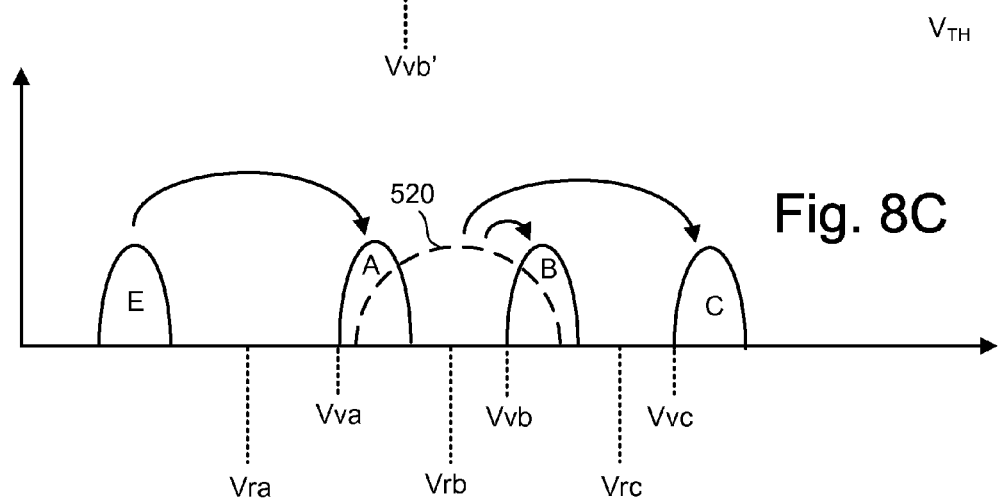
Fig. 8C
Fig. 9
|  | State E | State A | State B | State C |
|---|---|---|---|---|
| Upper Page | 1 | 0 | 0 | 1 |
| Lower Page | 1 | 1 | 0 | 0 |

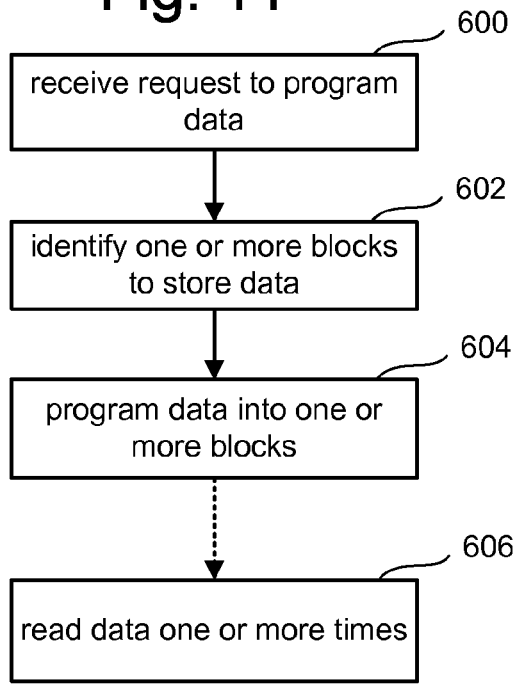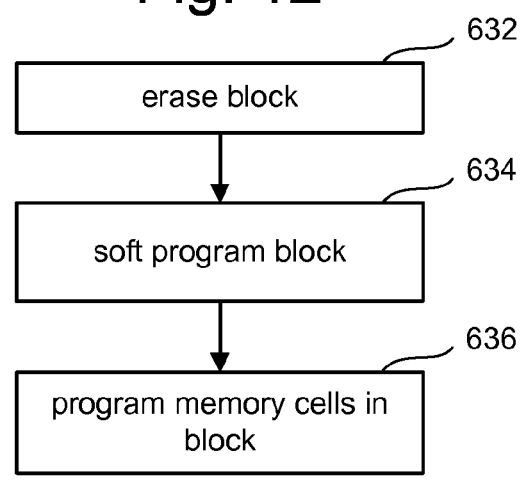

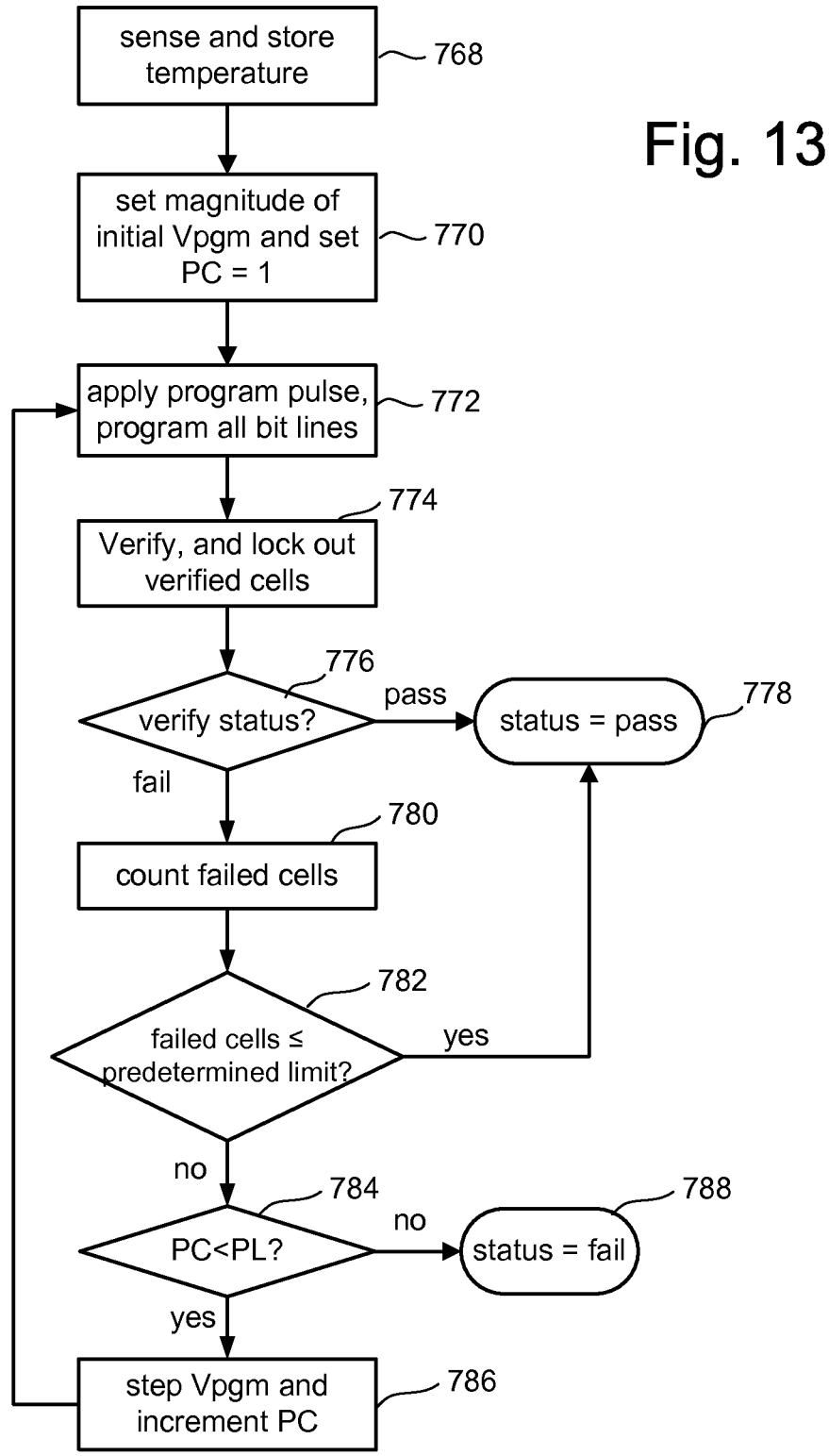

|  | E | A | B | C |
|---|---|---|---|---|
| Upper | -M2 | +M2 | +M2 | -M2 |
| Lower | -M3 | -M2 | +M2 | +M3 |

Initial LLRs based on hard data read results

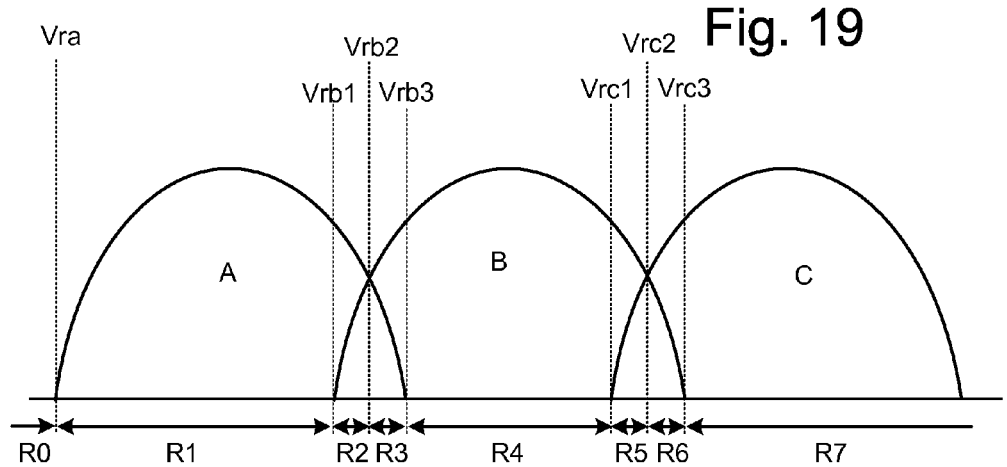
Fig. 19
Fig. 20
|  | R0 | R1 | R2 | R3 | R4 | R5 | R6 | R7 |
|---|---|---|---|---|---|---|---|---|
| Upper | -M2 | +M2 | +M3 | +M3 | +M2 | +M1 | -M1 | -M2 |
| Lower | -M5 | -M2 | -M1 | +M1 | +M2 | +M3 | +M4 | +M5 |
Initial LLRs based on soft data read results
Fig. 21
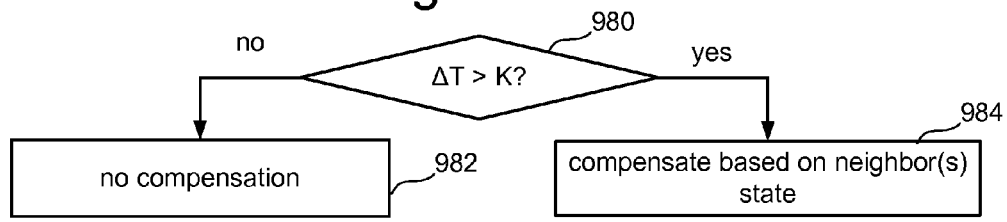

NON-VOLATILE STORAGE WITH TEMPERATURE COMPENSATION BASED ON NEIGHBOR STATE INFORMATION

CLAIM OF PRIORITY

This application is a continuation application of U.S. patent application Ser. No. 12/708,699, "Non-Volatile Storage With Temperature Compensation Based On Neighbor State Information," filed on Feb. 19, 2010, by Hemink, et al., incorporated herein by reference in its entirety.

BACKGROUND OF THE INVENTION

1. Field

The present invention relates to non-volatile storage.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in the programmed state. More information about programming can be found in U.S. Pat. No. 6,859,397, titled "Source Side Self Boosting Technique For Non-Volatile Memory;" and in U.S. Pat. No. 6,917,542, titled "Detecting Over Programmed Memory," both patents are incorporated herein by reference in their entirety.

Some EEPROM and flash memory devices have a floating gate that is used to store two ranges of charges and, therefore, the memory cell can be programmed/erased between two states, an erased state and a programmed state that correspond to data "1" and data "0." Such a device is referred to as a binary device.

A multi-state flash memory cell is implemented by identifying multiple, distinct allowed threshold voltage ranges. Each distinct threshold voltage range corresponds to a predetermined value for the set of data bits. The specific relationship between the data programmed into the memory cell and the threshold voltage ranges of the cell depends upon the data encoding scheme adopted for the memory cells. For example, U.S. Pat. No. 6,222,762 and U.S. Patent Application Publication No. 2004/0255090, both of which are incorporated herein by reference in their entirety, describe various data encoding schemes for multi-state flash memory cells.

It has been observed that the operation and behavior of integrated circuits, including non-volatile storage systems implemented on an integrated circuit, can be effected by temperature. Prior memory systems do compensate for temperature by adjusting read/verify compare levels, bit line currents, sense amps, control gate voltages on select gates, and body bias conditions based on temperature. Some systems use a temperature compensation coefficient referred to as TCO. In one embodiment, TCO indicates how much the threshold voltage of the memory cell changes per degree Celsius temperature change. The unit per TCO is millivolts per degree Celsius. A typical example TCO is −3 millivolts per degree Celsius. Some prior devices may also use advanced controller techniques to optimize the read levels by dynamically measuring the threshold voltage distributions and updating read compare levels based on the measures threshold voltage distributions.

As device sizes get smaller, there is an even greater need to compensate for temperature.

BRIEF DESCRIPTION OF THE DRAWINGS

FIG. 1A is a graph depicting a threshold voltage distribution.

FIG. 1 is a top view of a NAND string.

FIG. 2 is an equivalent circuit diagram of the NAND string.

FIGS. 8A-8C depict examples of threshold voltage distributions and an example programming process.

FIG. 9 is a table showing one example of a relationship between threshold voltage distributions and data stored in memory cells.

FIG. 11 is a flow chart describing one embodiment of a process for operating non-volatile storage.

FIG. 12 is a flow chart describing one embodiment of a process for programming non-volatile storage.

FIG. 13 is a flow chart describing one embodiment of a process for performing programming operations for non-volatile storage.

FIG. 19 depicts overlapping threshold voltage ranges.

FIG. 20 depicts an example LRR table.

FIG. 21 is a flow chart describing one embodiment of a process for providing compensation as part of a read process.

DETAILED DESCRIPTION

Figure 3:
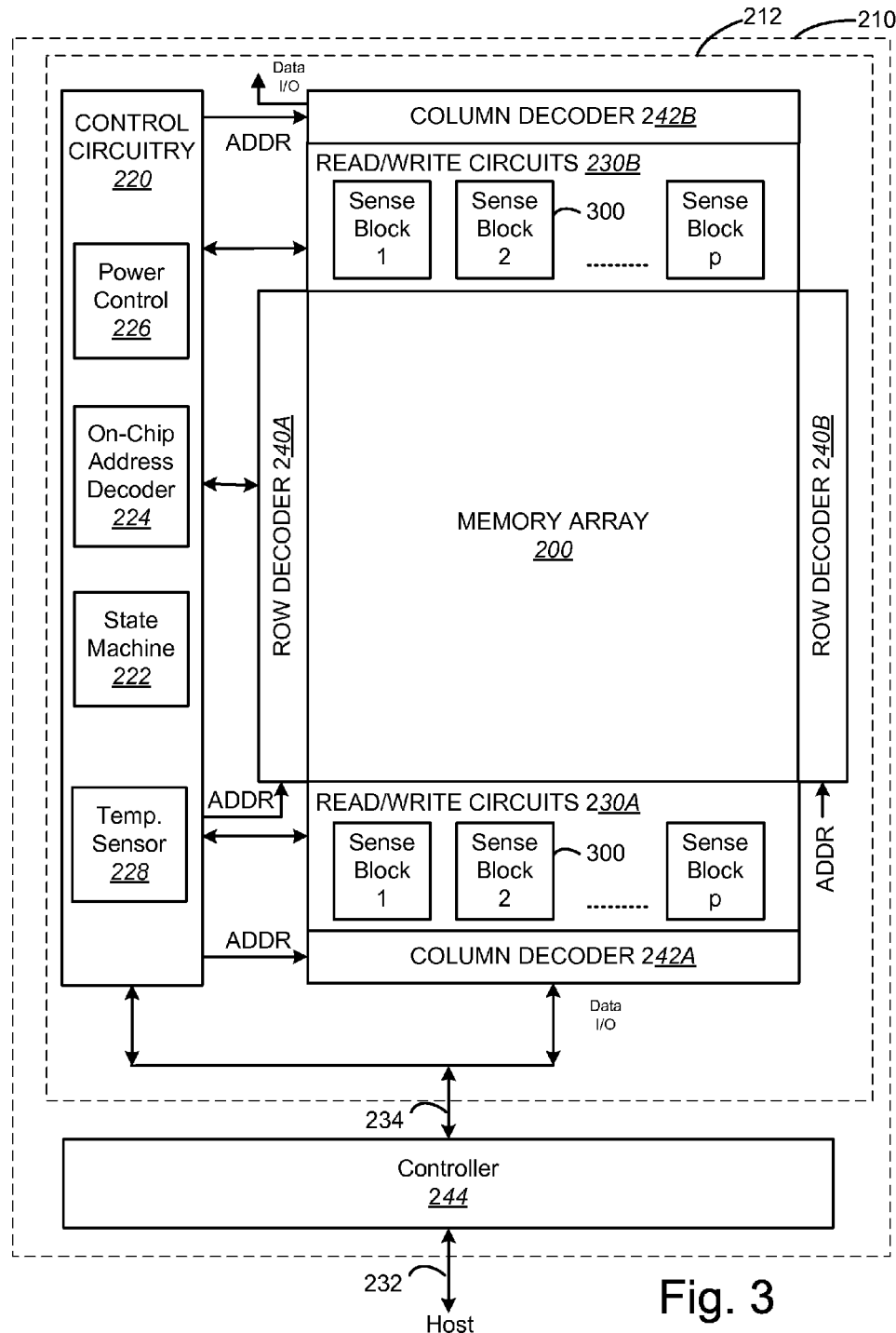
FIG. 3 is a block diagram of a non-volatile memory system.

The effect that temperature has on the behavior and operation of a given memory cell varies based on the conditions of the memory cells that are adjacent to or nearby the given memory cell. Therefore, it is proposed to provide temperature compensation that is based on temperature as well as the condition (or state) of one or more neighbor memory cells.

FIG. 1A provides an example of how temperature and temperature differences between the time of programming and the time of reading can cause a shift and widening of the threshold voltage (Vt) distributions. The Vt distribution A, is the Vt distribution obtained directly after programming at a relatively high temperature. The Vt distribution A has, in this example, a width of about 0.6V at a 10-bit upper and lower tail level. However, when the same Vt distribution is measured at a lower temperature, then the Vt distribution shifts up and widens to form Vt distribution D. The Vt distribution shifts up because the non-volatile storage elements have a negative temperature coefficient (Tco). However, as there is variation in Tco between non-volatile storage elements, the Vt distribution also widens. For example, non-volatile storage elements in distribution C (which is a subset of the total set of non-volatile storage elements in distribution D) have a larger Tco than non-volatile storage elements in distribution B. Both subsets B and C form together the set of non-volatile storage elements D which consists of the same non-volatile storage elements as distribution A. In this case, the difference in Tco of non-volatile storage elements in distribution B and C is substantial and results thus in a significant Vt distribution widening of about 0.2V in this example.

Such a large difference in Tco can occur in highly scaled non-volatile storage elements in which there is close interaction between neighboring non-volatile storage elements. It has been found that the Tco of a non-volatile storage element depends on the data that is stored in neighboring non-volatile storage elements. In particular, a large Tco occurs when neighboring non-volatile storage elements are in a significantly lower programmed (or erased) state than the target non-volatile storage element. The Tco of a non-volatile storage element is small when the neighboring non-volatile storage elements are programmed to a similar or higher programmed state. By taking the knowledge of the programmed state of the neighboring non-volatile storage elements into account, the Tco of the target non-volatile storage element is more accurately known, and thus, a more accurate read operation with adapted sense levels or other compensation techniques can be applied based on the temperature difference between programming and read and based on neighboring non-volatile storage elements data state.

Data is programmed into and read from a set of target memory cells. When reading the data, temperature compensation is provided. The temperature compensation is based on temperature information and the state of one or more neighbor memory cells. In one embodiment, when data is read from a set of target memory cells, the system senses the current temperature and determines the difference in temperature between the current temperature and the temperature at the time the data was programmed. If the difference in temperature is greater than a threshold, then the process of reading the data includes providing temperature compensation based on temperature information and neighbor state information. In one alternative, the decision to provide the temperature compensation can be triggered by conditions other than a temperature differential.

One example of a non-volatile storage system that can be used to implement the technology described herein is a flash memory system that uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first (drain side) select gate 120 and a second (source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four memory cells is only provided as an example. A NAND string can have less than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND structure will include several NAND strings. Each NAND string is connected to the common source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to a sense amplifier.

Relevant examples of NAND type flash memories and their operation are provided in the following U.S. patents/patent applications, all of which are incorporated herein by reference: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348.

Other types of non-volatile storage devices, in addition to NAND flash memory, can also be used. For example, non-volatile memory devices are also manufactured from memory cells that use a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. U.S. Pat. Nos. 5,768,192 and 6,011,725 disclose a non-volatile memory cell having a trapping dielectric sandwiched between two silicon dioxide layers. Multi-state data storage is implemented by separately reading the binary states of the spatially separated charge storage regions within the dielectric. Non-volatile storage based on MONOS or TANOS types of structures or nanocrystals can also be used. Other types of non-volatile storage can also be used.

FIG. 3 illustrates a memory device 210 having read/write circuits for reading and programming a page (or other unit) of memory cells (e.g., NAND multi-state flash memory) in parallel. Memory device 210 may include one or more memory die or chips 212. Memory die (or integrated circuit) 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. Word lines and bit lines are examples of control lines. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234.

Control circuitry 220 cooperates with the read/write circuits 230A and 230B to perform memory operations on the memory array 200. The control circuitry 220 includes a state machine 222, an on-chip address decoder 224, a power control module 226, and temperature sensor 228. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage. Control circuitry 220 provides address lines ADDR to row decoders 240A and 204B, as well as column decoders 242A and 242B. Column decoders 242A and 242B provide data to controller 244 via the signal lines marked Data I/O. Temperature sensor 228 can be an analog or digital temperature sensor known in the art.

In one embodiment, controller 244 is implemented on a different die (or integrated circuit) than memory chip 212. In some embodiments, the controller 244 interfaces with the Host and with control circuitry 220 as well as the decoders. In some embodiments, controller 244 interfaces with the read/write circuits.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, temperature sensor 228 and/or controller 244 can be referred to as one or more managing circuits. The one or more managing circuits perform the processes described herein.

Figure 4:
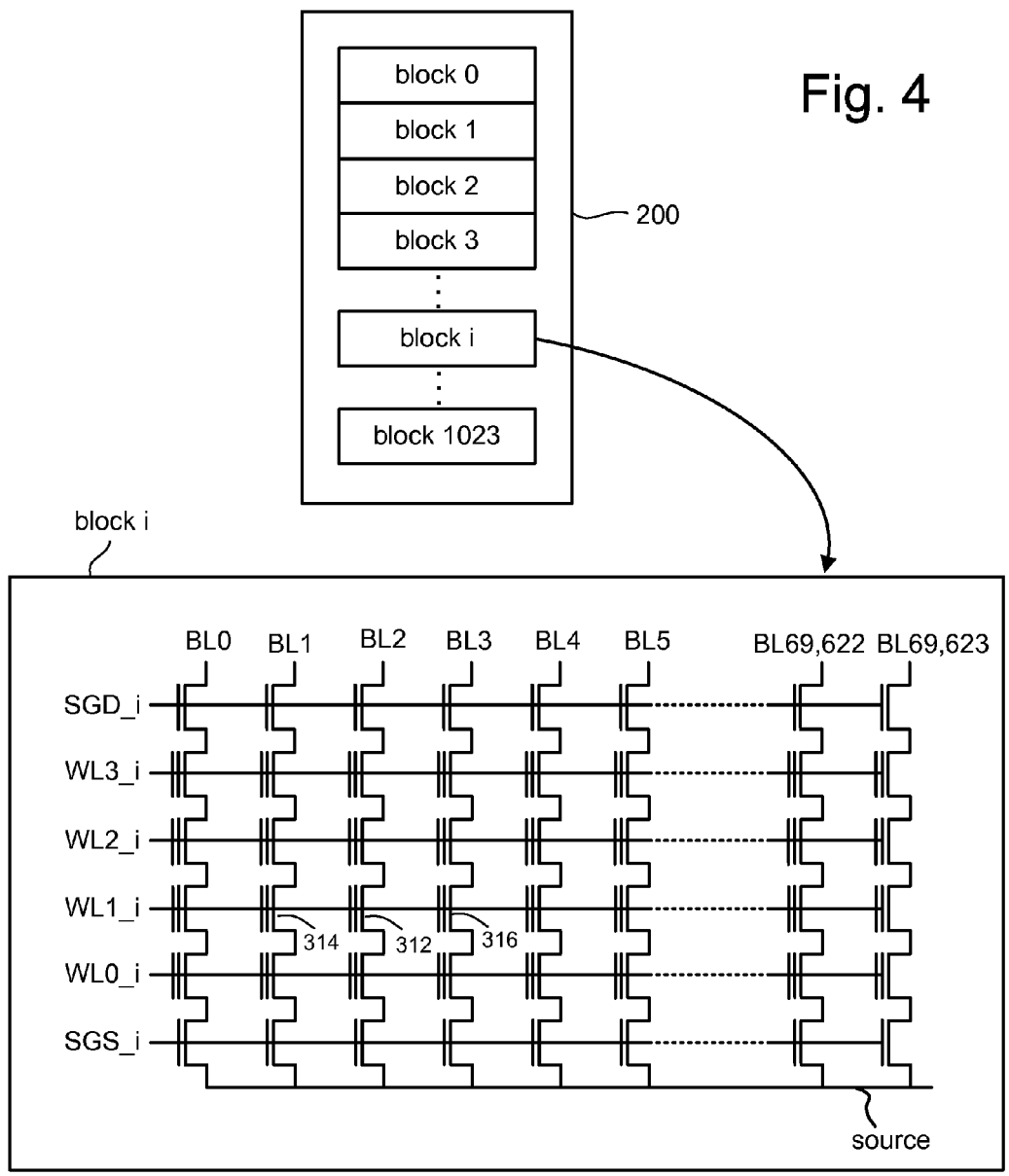
FIG. 4 is a block diagram depicting one embodiment of a memory array.

FIG. 4 depicts an exemplary structure of memory cell array 200. In one embodiment, the array of memory cells is divided into a large number of blocks (e.g., blocks 0-1023, or another amount of blocks) of memory cells. As is common for flash memory systems, the block is the unit of erase. That is, each block contains the minimum number of memory cells that are erased together. Other units of erase can also be used.

A block contains a set of NAND stings which are accessed via bit lines (e.g., bit lines BL0-BL69,623) and word lines (WL0, WL1, WL2, WL3). FIG. 4 shows four memory cells connected in series to form a NAND string. Although four cells are shown to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS).

Each block is typically divided into a number of pages. In one embodiment, a page is a unit of programming. Other units of programming can also be used. One or more pages of data are typically stored in one row of memory cells. For example, one or more pages of data may be stored in memory cells connected to a common word line. A page can store one or more sectors. A sector includes user data and overhead data (also called system data). A sector of user data is typically 512 bytes, corresponding to the size of a sector in magnetic disk drives. A large number of pages form a block, anywhere from 8 pages, for example, up to 32, 64, 128 or more pages. Different sized blocks, pages and sectors can also be used. Additionally, a block can have more or less than 69,624 bit lines.

Figure 5:
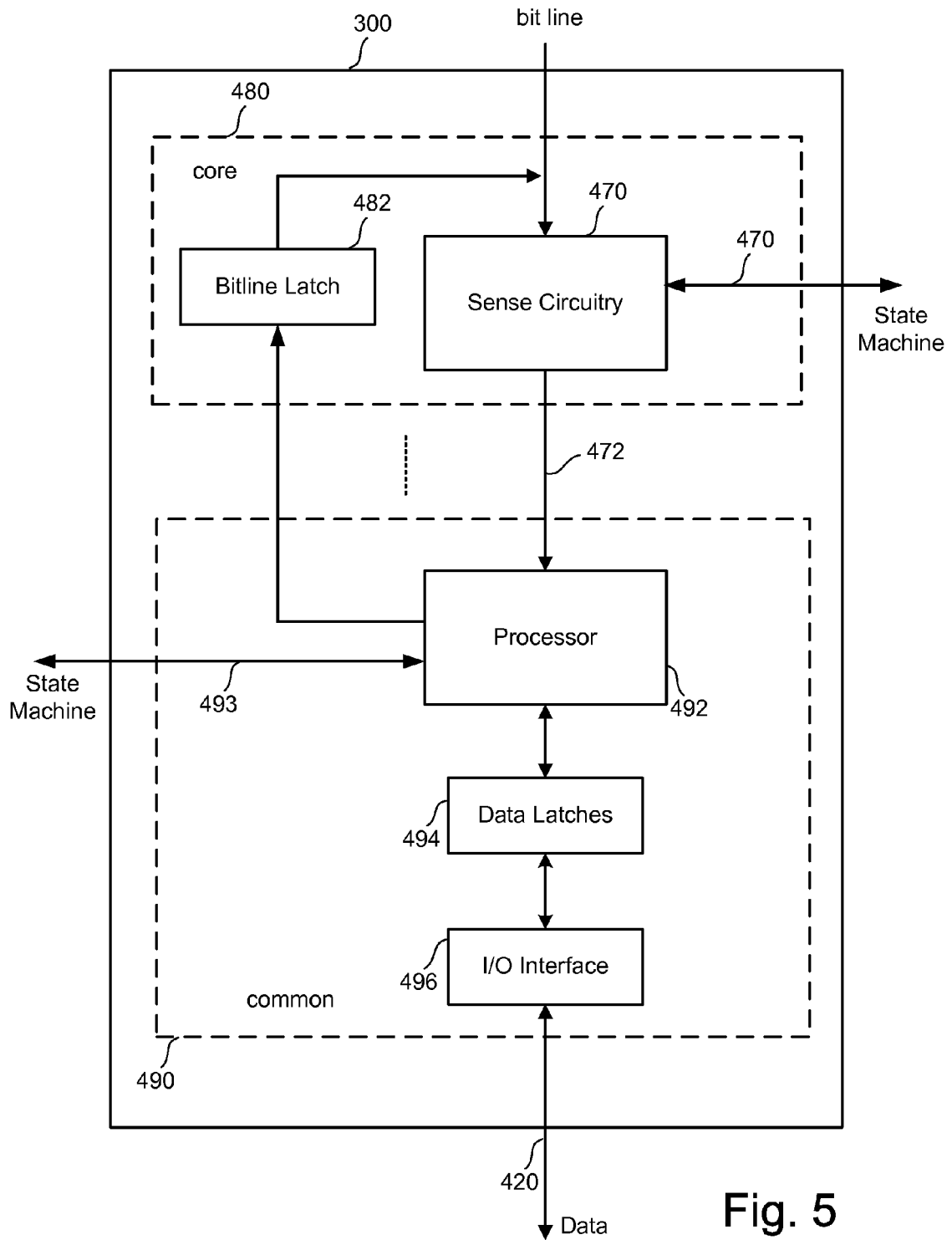
FIG. 5 is a block diagram depicting one embodiment of a sense block.

FIG. 5 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. One example can be found in U.S. Patent Application Publication 2006/0140007, which is incorporated herein by reference in its entirety.

Sense module 480 comprises sense circuitry 470 that determines whether a conduction current in a connected bit line is above or below a predetermined level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd) in order to lock out memory cells from programming.

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls (using power control 226) the supply of different control gate voltages to the addressed memory cell(s). As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 5) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

Data latch stack 494 contains a stack of data latches corresponding to the sense module. In one embodiment, there are three (or four or another number) data latches per sense module 480. In one embodiment, the latches are each one bit.

During program or verify, the data to be programmed is stored in the set of data latches 494 from the data bus 420. During the verify process, Processor 492 monitors the verified memory state relative to the desired memory state. When the two are in agreement, processor 492 sets the bit line latch 482 so as to cause the bit line to be pulled to a state designating program inhibit. This inhibits the memory cell coupled to the bit line from further programming even if it is subjected to programming pulses on its control gate. In other embodiments the processor initially loads the bit line latch 482 and the sense circuitry sets it to an inhibit value during the verify process.

In some implementations (but not required), the data latches are implemented as a shift register so that the parallel data stored therein is converted to serial data for data bus 420, and vice versa. In one preferred embodiment, all the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the sensing operations and sense amplifiers can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. Patent Application Pub. No. 20050169082; (4) U.S. Patent Publication 2006/0221692, titled "Compensating for Coupling During Read Operations of Non-Volatile Memory," Inventor Jian Chen, filed on Apr. 5, 2005; and (5) U.S. Patent Application Publication No. 2006/0158947, titled "Reference Sense Amplifier For Non-Volatile Memory," Inventors Siu Lung Chan and Raul-Adrian Cernea, filed on Dec. 28, 2005. All five of the immediately above-listed patent documents are incorporated herein by reference in their entirety.

Figure 6:
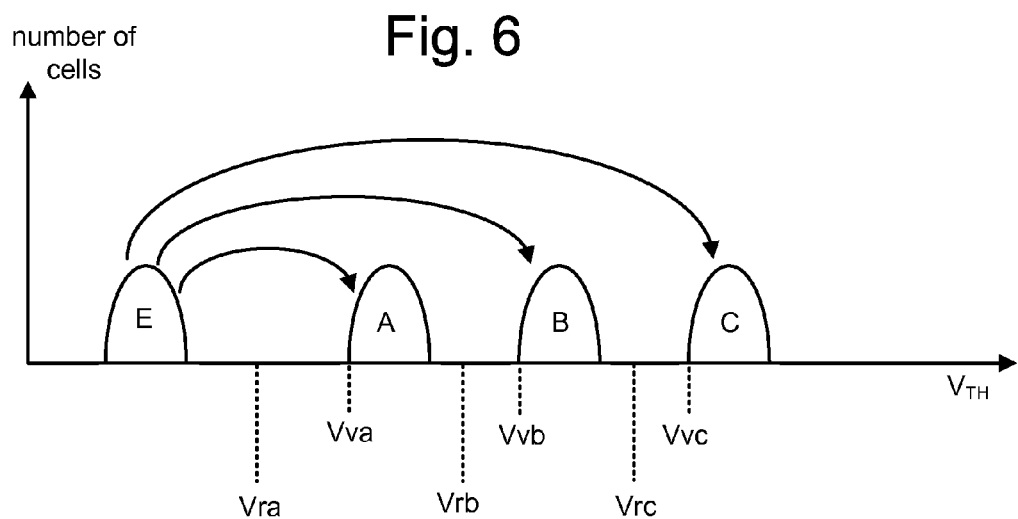
FIG. 6 depicts an example set of threshold voltage distributions and depicts an example programming process.

At the end of a successful programming process (with verification), the threshold voltages of the memory cells should be within one or more distributions of threshold voltages for programmed memory cells or within a distribution of threshold voltages for erased memory cells, as appropriate. FIG. 6 illustrates example threshold voltage distributions (corresponding to data states) for the memory cell array when each memory cell stores two bits of data. Other embodiments, however, may use more or less than two bits of data per memory cell (e.g., such as three, or four or more bits of data per memory cell).

FIG. 6 shows a first threshold voltage distribution E for erased memory cells. Three threshold voltage distributions A, B and C for programmed memory cells are also depicted. In one embodiment, the threshold voltages in the E distribution are negative and the threshold voltages in the A, B and C distributions are positive. Each distinct threshold voltage distribution of FIG. 6 corresponds to predetermined values for the set of data bits. The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, both of which are incorporated herein by reference in their entirety, describe various data encoding schemes for multistate flash memory cells. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although FIG. 6 shows four states, the present invention can also be used with other multi-state structures including those that include more or less than four states.

FIG. 6 also shows three read reference voltages, Vra, Vrb and Vrc (also called read compare levels/values), for reading data from memory cells. By testing whether the threshold voltage of a given memory cell is above or below Vra, Vrb and Vrc, the system can determine what state the memory cell is in. For example, if a memory cell has a threshold voltage less than Vra, it is assumed to be in state E. If a memory cell has a threshold voltage less than Vrb and greater than Vra, it is assumed to be in state A. If a memory cell has a threshold voltage less than Vrc and greater than Vrb, it is assumed to be in state B. If a memory cell has a threshold voltage greater than Vrc, it is assumed to be in state C.

FIG. 6 also shows three verify reference voltages, Vva, Vvb and Vvc (also called verify compare values/levels). When programming memory cells to state A, the system will test whether those memory cells have a threshold voltage greater than or equal to Vva. When programming memory cells to state B, the system will test whether the memory cells have threshold voltages greater than or equal to Vvb. When programming memory cells to state C, the system will determine whether memory cells have their threshold voltage greater than or equal to Vvc.

In one embodiment, known as full sequence programming, memory cells can be programmed from the erase state E directly to any of the programmed states A, B or C. For example, a population of memory cells to be programmed may first be erased so that all memory cells in the population are in erased state E. Then, a programming process is used to program memory cells directly into states A, B or C. While some memory cells are being programmed from state E to state A, other memory cells are being programmed from state E to state B and/or from state E to state C.

Figure 7:
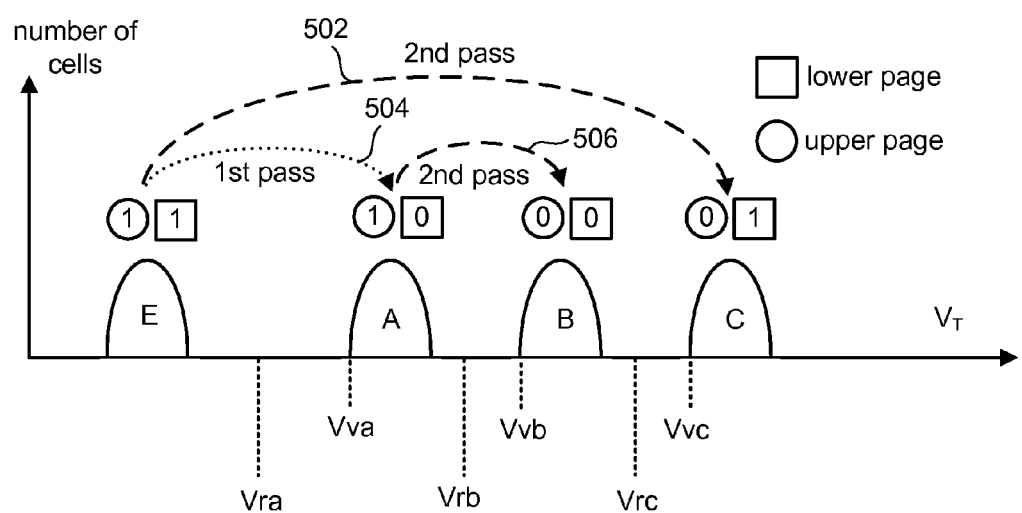
FIG. 7 depicts an example set of threshold voltage distributions and depicts an example programming process.
Figure 10A:
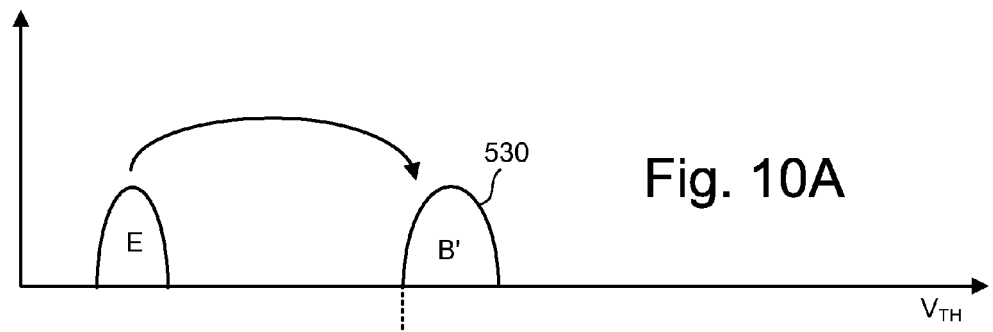
FIGS. 10A-10D depict examples of threshold voltage distributions and an example programming process.
Figure 10B:
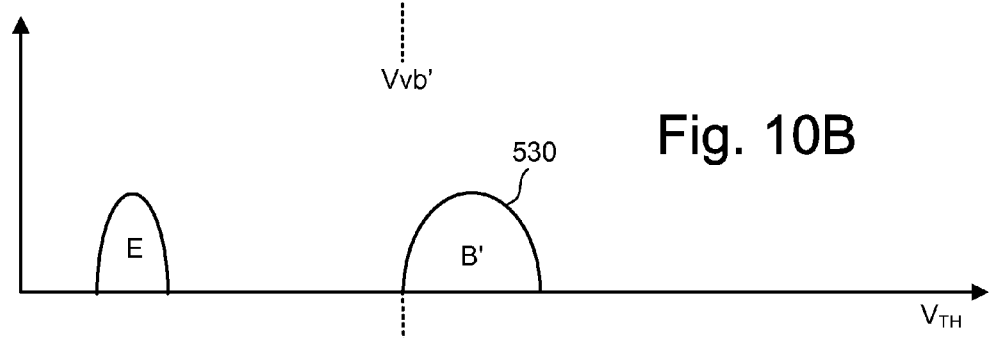
Figure 10C:
Figure 10D:
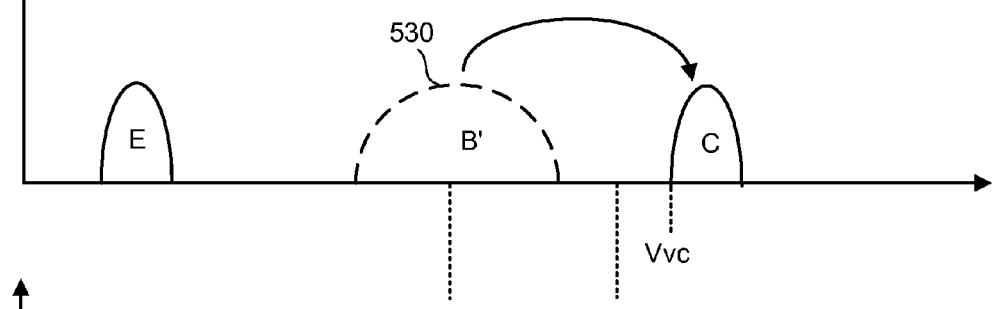

FIG. 7 illustrates one example of a two-stage technique of programming a multi-state memory cell that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned. In a first programming stage, the memory cells' threshold voltages levels are set according to the bit to be programmed into the lower logical page. If that bit is a logic "1," the threshold voltage is not changed since the respective memory cell is in the appropriate state as a result of having been earlier erased. However, if the bit to be programmed is a logic "0," the threshold level of the cell is increased to be state A, as shown by arrow 504. That concludes the first programming stage.

In a second programming stage, the memory cell's threshold voltage level is set according to the bit being programmed into the upper logical page. If the upper logical page bit is to store a logic "1," then no programming occurs since the memory cell is in one of states E or A, depending upon the programming of the lower page bit, both of which carry an upper page bit of "1." If the upper page bit is to be a logic "0," then the threshold voltage is shifted. If the first stage resulted in the memory cell remaining in the erased state E, then in the second stage the memory cell is programmed so that the threshold voltage is increased to be within state C, as depicted by arrow 502. If the memory cell had been programmed into state A as a result of the first programming stage, then the memory cell is further programmed in the second stage so that the threshold voltage is increased to be within state B, as depicted by arrow 506. The result of the second stage is to program the memory cell into the state designated to store a logic "0" for the upper page without changing the data for the lower page.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's memory cells. More details of such an embodiment are disclosed in U.S. Patent Application 2006/0126390, incorporated herein by reference in its entirety.

FIGS. 8A-C describe another multi-stage programming process for programming non-volatile memory. The process of FIG. 8A-C reduces floating gate to floating gate coupling by, for any particular memory cell, writing to that particular memory cell with respect to a particular page subsequent to writing to adjacent memory cells for previous pages. In one example of an implementation of the process taught by FIGS. 8A-C, the non-volatile memory cells store two bits of data per memory cell, using four data states. For example, assume that state E is the erased state and states A, B and C are the programmed states. FIG. 9 shows one example of the relationship between states and data stored. State E stores data 11. State A stores data 01. State B stores data 00. State C stores data 10 This is an example of Gray coding. Other encodings of data to physical data states can also be used. Each memory cell stores two pages of data. For reference purposes, these pages of data will be called upper page and lower page; however, they can be given other labels. With reference to state A for the process of FIGS. 8A-C, the upper page stores data 0 and the lower page stores data 1. With reference to state B, both pages stores data 0. With reference to state C, the lower pages stores data 0 and the upper page stores data 1. The programming process of FIGS. 8A-C is a two-stage programming process; however, the process of FIGS. 8A-C can be used to implement a three stage process, a four stage process, etc. In the first stage, the lower page is programmed. If the lower page is to remain data 1, then the memory cell state remains at state E. If the data is to be programmed to 0, then the threshold of voltage of the memory cell is raised such that the memory cell is programmed to state B'. FIG. 8A therefore shows the programming of memory cells from state E to state B'. State B' depicted in FIG. 8A is an interim state B; therefore, the verify point is depicted as Vvb', which is lower than Vvb.

In one embodiment, after a memory cell is programmed from state E to state B', its neighbor memory cell (on word line WLn+1) in the NAND string will then be programmed with respect to its lower page. After programming the neighbor memory cell, the floating gate to floating gate coupling effect may raise the apparent threshold voltage of earlier programmed memory cell. This will have the effect of widening the threshold voltage distribution for state B' to that depicted as threshold voltage distribution 520 of FIG. 8B. This apparent widening of the threshold voltage distribution will be remedied when programming the upper page.

FIG. 8C depicts the process of programming the upper page. If the memory cell is in erased state E and the upper page is to remain at 1, then the memory cell will remain in state E. If the memory cell is in state E and its upper page data is to be programmed to 0, then the threshold voltage of the memory cell will be raised so that the memory cell is in state A. If the memory cell was in intermediate threshold voltage distribution 520 and the upper page data is to remain at 1, then the memory cell will be programmed to final state C. If the memory cell is in intermediate threshold voltage distribution 520 and the upper page data is to become data 0, then the memory cell will be to state B. The process depicted by FIGS. 8A-C reduces the effect of floating gate to floating gate coupling because only the upper page programming of neighbor memory cells will have an effect on the apparent threshold voltage of a given memory cell.

Although FIGS. 8A-C provide an example with respect to four data states and two pages of data, the concepts taught by FIGS. 8A-C can be applied to other implementations with more or less than four states and different than two pages. More details about the programming process of FIG. 8A-C can be found in U.S. Pat. No. 7,196,928, incorporated herein by reference.

FIGS. 10A-D describe another multi-state programming process that programs memory cells connected to a common word line and can be used in a similar manner to the process of FIGS. 8A-C. The first stage of the process of FIGS. 10A-D includes first programming memory cells targeted for threshold voltage distributions B and C to an intermediate threshold voltage distribution B', as depicted by threshold voltage distribution 530 in FIG. 10A. This first stage is then performed on an adjacent word line, which causes the intermediate threshold voltage distribution to widen due to coupling from neighboring floating gates (see FIG. 10B). The second programming stage includes programming those memory cells that are targeted for threshold voltage distribution C from B' (see FIG. 10C). The third stage of the programming process includes programming memory cells from distribution E to distribution A and from B' to B (see FIG. 10D).

FIG. 11 is a flow chart describing one embodiment of a process for operating non-volatile memory, such as the system of FIG. 3 (or other systems). In step 600, a request to program data is received. The request can be from a host, another device or the controller. The request can be received at the controller, control circuitry, state machine, or other device. In response to the request, the controller, control circuitry, state machine, or other device will determine which block of flash memory cells will be used to store the data in step 602. The data will be programmed into the determined block using any of the programming processes described above (or other programming processes) in step 604. The programmed data will be read one or many times in step 606. There is a dashed line between steps 604 and 606 because an unpredictable amount of time may pass between the steps, and step 606 is not performed in response to step 604. Rather, step 606 is performed in response to a request to read the data or other event.

FIG. 12 is a flow chart describing a programming process for programming memory cells in a block. The process of FIG. 12 is one embodiment of step 604 of FIG. 11. In step 632, memory cells are erased (in blocks or other units) prior to programming. Memory cells are erased in one embodiment by raising the p-well to an erase voltage (e.g., 20 volts) for a sufficient period of time and grounding the word lines of a selected block while the source and bit lines are floating. A strong electric field is, thus, applied to the tunnel oxide layers of selected memory cells and the selected memory cells are erased as electrons of the floating gates are emitted to the substrate side, typically by Fowler-Nordheim tunneling mechanism. As electrons are transferred from the floating gate to the p-well region, the threshold voltage of the selected memory cells is lowered. Erasing can be performed on the entire memory array, on individual blocks, or another unit of cells. Other techniques for erasing can also be used. In step 634, soft programming is performed to narrow the threshold voltage distribution of the erased memory cells. Some memory cells may be in a deeper erased state than necessary as a result of the erase process. Soft programming can apply programming pulses to move the threshold voltage of the deeper erased memory cells to a higher threshold voltage that is still in a valid range for the erased state. In step 636, the memory cells of the block are programmed as described herein. The process of FIG. 12 can be performed at the direction of the state machine, controller or combination of state machine and controller, using the various circuits described above. For example, the controller may issue commands and data to the state machine to program the data. In response, the state machine may operate the circuits described above to carry out the programming operations.

FIG. 13 is a flow chart describing one embodiment of a process for performing programming on memory cells connected to a common word line. The process of FIG. 13 can be performed one or multiple times during step 636 of FIG. 12. For example, the process of FIG. 13 can be used to program memory cells (e.g., full sequence programming) from state E directly to any of states A, B or C. Alternatively, the process of FIG. 13 can be used to perform one or each of the stages of the process of FIG. 7, FIGS. 8A-C, FIGS. 10A-D, or other programming schemes. For example, when performing the process of FIGS. 8A-C, the process of FIG. 13 is used to implement the first stage that includes programming some of the memory cells from state E to state B'. The process of FIG. 13 can then be used again to implement the second stage that includes programming some of the memory cells from state E to state A from state B' to states B and C.

In step 768 of FIG. 13, the current temperature is sensed using temperature sensor 228. That temperature reading is stored in the memory array or other non-volatile storage. In some embodiments, the temperature reading is immediately sent to controller 244 for storage by the controller. In some implementations, the temperature can be sensed by a sensor that is not on the memory circuit (e.g., on controller, on host, or other location).

Typically, the program voltage applied to the control gate during a program operation is applied as a series of program pulses. Between programming pulses are a set of one or more verify pulses to perform verification. In many implementations, the magnitude of the program pulses is increased with each successive pulse by a predetermined step size. In step 770 of FIG. 13, the programming voltage (Vpgm) is initialized to the starting magnitude (e.g., ~12-16V or another suitable level) and a program counter PC maintained by state machine 222 is initialized at 1.

In step 772, a program pulse of the program signal Vpgm is applied to the selected word line (the word line selected for programming). In one embodiment, the group of memory cells being programmed are all connected to the same word line (the selected word line). The unselected word lines receive one or more boosting voltages (e.g., ~9 volts) to perform boosting schemes known in the art. In one embodiment, if a memory cell should be programmed, then the corresponding bit line is grounded. On the other hand, if the memory cell should remain at its current threshold voltage, then the corresponding bit line is connected to Vdd to inhibit programming. In step 772, the program pulse is concurrently applied to all memory cells connected to the selected word line so that all of the memory cells connected to the selected word line are programmed concurrently. That is, they are programmed at the same time (or during overlapping times). In this manner all of the memory cells connected to the selected word line will concurrently have their threshold voltage change, unless they have been locked out from programming. In step 774, the appropriate memory cells are verified using the appropriate set of target levels to perform one or more verify operations. If a memory cell is verified to have reached its target, it is locked out from further programming. One embodiment for locking out a memory cell from further programming is to raise the corresponding bit line voltage to, for example, Vdd.

In step 776, it is determined whether all the memory cells have reached their target threshold voltages. If so, the programming process is complete and successful because all selected memory cells were programmed and verified to their target states. A status of "PASS" is reported in step 778. If, in 776, it is determined that not all of the memory cells have reached their target threshold voltages, then the programming process continues to step 780.

In step 780, the system counts the number of memory cells that have not yet reached their respective target threshold voltage distribution. That is, the system counts the number of cells that have failed the verify process. This counting can be done by the state machine, the controller, or other logic. In one implementation, each of the sense block 300 (see FIG. 3) will store the status (pass/fail) of their respective cells. These values can be counted using a digital counter. As described above, many of the sense blocks have an output signal that is wire-Or'd together. Thus, checking one line can indicate that no cells of a large group of cells have failed verify. By appropriately organizing the lines being wired-Or together (e.g., a binary tree-like structure), a binary search method can be used to determine the number of cells that have failed. In such a manner, if a small number of cells failed, the counting is completed rapidly. If a large number of cells failed, the counting takes a longer time. More information can be found in United States Patent Publication 2008/0126676, incorporated herein by reference in its entirety. In another alternative, each of the sense amplifiers can output an analog voltage or current if its corresponding memory cell has failed and an analog voltage or current summing circuit can be used to count the number of memory cells that have failed.

In one embodiment, there is one total counted, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by ECC during a read process for the page of memory cells. If the number of failed cells is less than or equal to the predetermined limit, than the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed, temperature or other criteria.

If the number of failed cells is not less than the predetermined limit, than the programming process continues at step 784 and the program counter PC is checked against the program limit value (PL). One example of a program limit value is 20; however, other values can be used. If the program counter PC is not less than the program limit value PL, then the program process is considered to have failed and a status of FAIL is reported in step 788. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 786, the process loops back to step 772 and another program pulse is applied to the selected word line.

During verify operations (e.g., step 774) and read operations, the selected word line is connected to a voltage, a level of which is specified for each read operation (e.g., Vra, Vrb, and Vrc,) or verify operation (e.g. Vva, Vvb, and Vvc) in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. More information about verifying/reading can be found in the following patent documents that are incorporated herein by reference in their entirety: (1) United States Patent Application Pub. No. 2004/0057287; (2) United States Patent Application Pub No. 2004/0109357; (3) U.S. Patent Application Pub. No. 2005/0169082; and (4) U.S. Patent Application Pub. No. 2006/0221692. The erase, read and verify operations described above are performed according to techniques known in the art. Thus, many of the details explained can be varied by one skilled in the art. Other erase, read and verify techniques known in the art can also be used.

After completing programming, the memory cells will be in one or more threshold voltage distributions, as depicted by FIGS. 6-10. At this point, the data is available to be read. In many cases, the data can be read at a time significantly subsequent to the time when it is programmed. In some instances, the temperature of the memory system during programming may not be the same as the temperature while performing a read operation. This change in temperature can affect performance, including introducing errors into the read operation.

It is well known that integrated circuits will perform differently in different temperature ranges. Prior memory systems do compensate for temperature by adjusting read/verify compare levels, bit line currents, sense amps, control gate voltages on select gates, and body bias conditions based on temperature.

It has been observed that read processes can fail when there is a significant temperature change between the time of programming and the time of reading. When temperature increases, threshold voltage distributions tend to shift downward. It is also observed that higher states (e.g. C state) will shift downward more than lower states (e.g. A state).

With memory systems that position the data states close to each other, or even overlapping, the above-described counter measures for temperature changes may not do a good enough job to account for the threshold voltage distributions widening in response to temperature differentials between programming and read time.

The inventors have observed that one explanation for the various widening of the threshold voltages in response to temperatures changes between the time programming was performed and the time reading was performed is due to the effect on a target memory cell provided by neighboring memory cells. That is, the data state of the neighboring memory cell will have an effect on the TCO of a target memory cell. Neighboring memory cells, which affect a target memory cell, include memory cells next to the target memory cell on the same word line or next to the target memory cell on the same bit line. Additionally, a neighboring memory cell can also be diagonal to the target memory cell (e.g. over one bit line and over one word line).

Therefore, it is proposed that the memory system make a decision to provide temperature compensation based on the difference in temperature between the time memory was programmed and the time memory is read. The temperature compensation provided will take into account temperature data and the data state of the neighboring memory cells.

Figure 14:
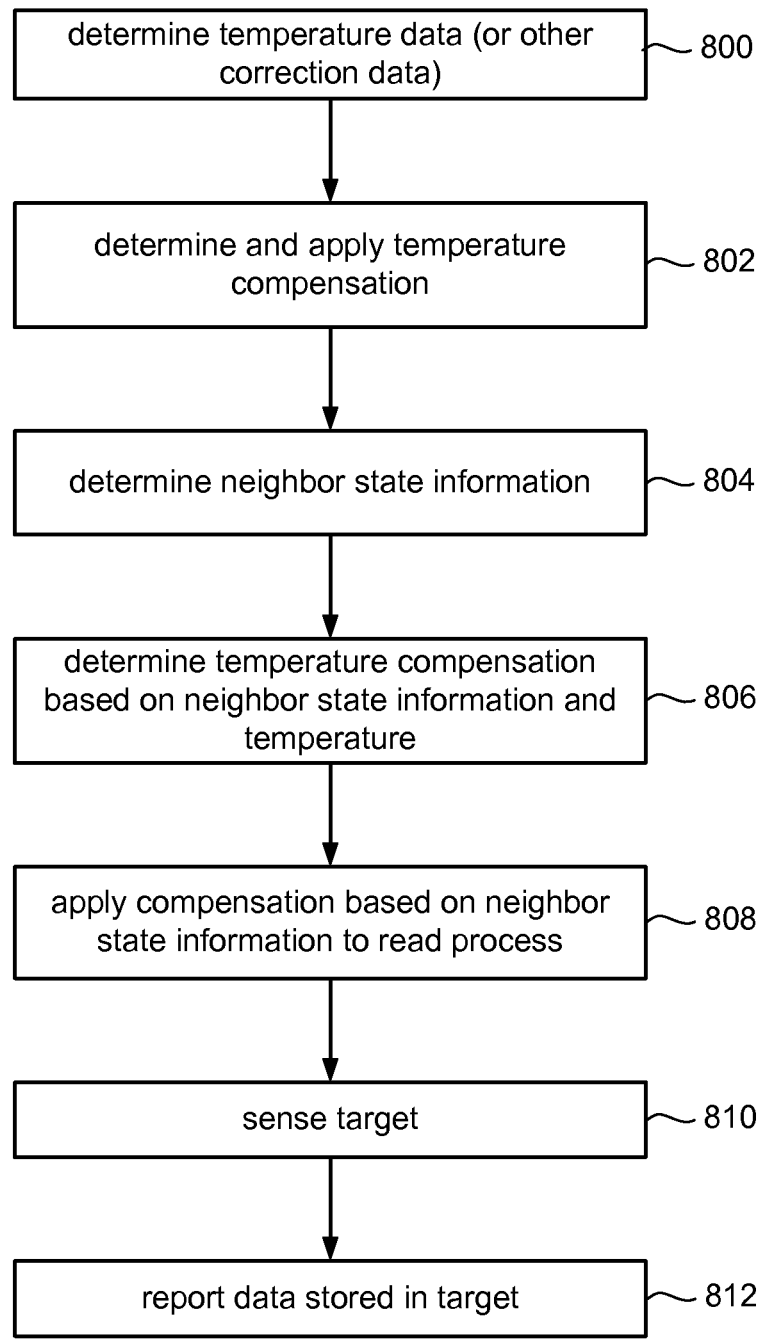
FIG. 14 is a flow chart describing one embodiment of a process for reading data from non-volatile storage.

FIG. 14 is a flow chart describing a read process that performs temperature compensation based on temperature data and the data state of the neighboring memory cells. The process of FIG. 14 can be performed in response to a request from a host to read data or as part of the internal process for reading data. In step 800 of FIG. 14, the system will determine temperature data. In one embodiment, the system will take a reading of the current temperature. In one embodiment, there is a temperature sensor in communication with controller 244, state machine 222, or other circuits. In another embodiment, temperature sensor 228, on the memory chip, is used to provide temperature data to state machine 222, controller 244, or another circuit. In another embodiment, controller 244 includes an onboard temperature sensor. In another embodiment, the host will provide temperature data to controller 244. No specific means for obtaining the current temperature is required. Step 800 can also include obtaining historical temperature data, including the temperature of the memory system when the data was programmed. In step 802, the system will determine and apply appropriate temperature compensation. Step 802 is a standard temperature compensation known in the art. For example, read compare levels, sense currents, sense amplifier performance, and other operating conditions can be changed based on the current temperature or the difference between the current temperature and the temperature that existed when programming the data. The temperature compensation determined and applied in step 802 does not take into account neighbor state information.

In step 804, the system will obtain the neighbor state information. For example, looking back at FIG. 4, assume that a target memory cell to be read is memory cell 312. Two examples of neighbor memory cells on the same word line are memory cells 314 and 316. Neighbor cells in the same bit line can also be neighbor memory cells. Step 804 of FIG. 14 includes determining the state (e.g. E, A, B or C) of memory cells 314 and/or 316 (as well as other memory cells that are on the same bit line as memory cell 312). In step 806, the system will determine additional temperature compensation that is based on the neighbor state information obtained in step 804 as well as temperature data. More details of step 806 are provided below. In step 808, the temperature compensation determined in step 806 is applied to the read process in step 808. More details of step 808 are provided below. In step 810, the target memory cell is sensed using a read operation that includes the compensation discussed above in step 802, 806 and 808. In step 812, the data sensed in the target memory cell is reported. An example of step 812 includes reporting the data to controller 244, reporting the data from controller 244 to the host, or otherwise displaying the data to a user. Note that the order of steps can be changed from that order depicted in FIG. 14. Many of the steps can be performed in a different order or can be performed concurrently. For example, the two sets of temperature compensation (step 802 and step 808) can be performed before the sensing of the target memory cell(s), during the sensing of the target memory cell(s) or after the sensing of the target memory cell(s) of step 810. Additionally, the two types of temperature compensation can be combined or only the compensation of step 808 can be used (omitting the compensation of step 802).

Figure 15:
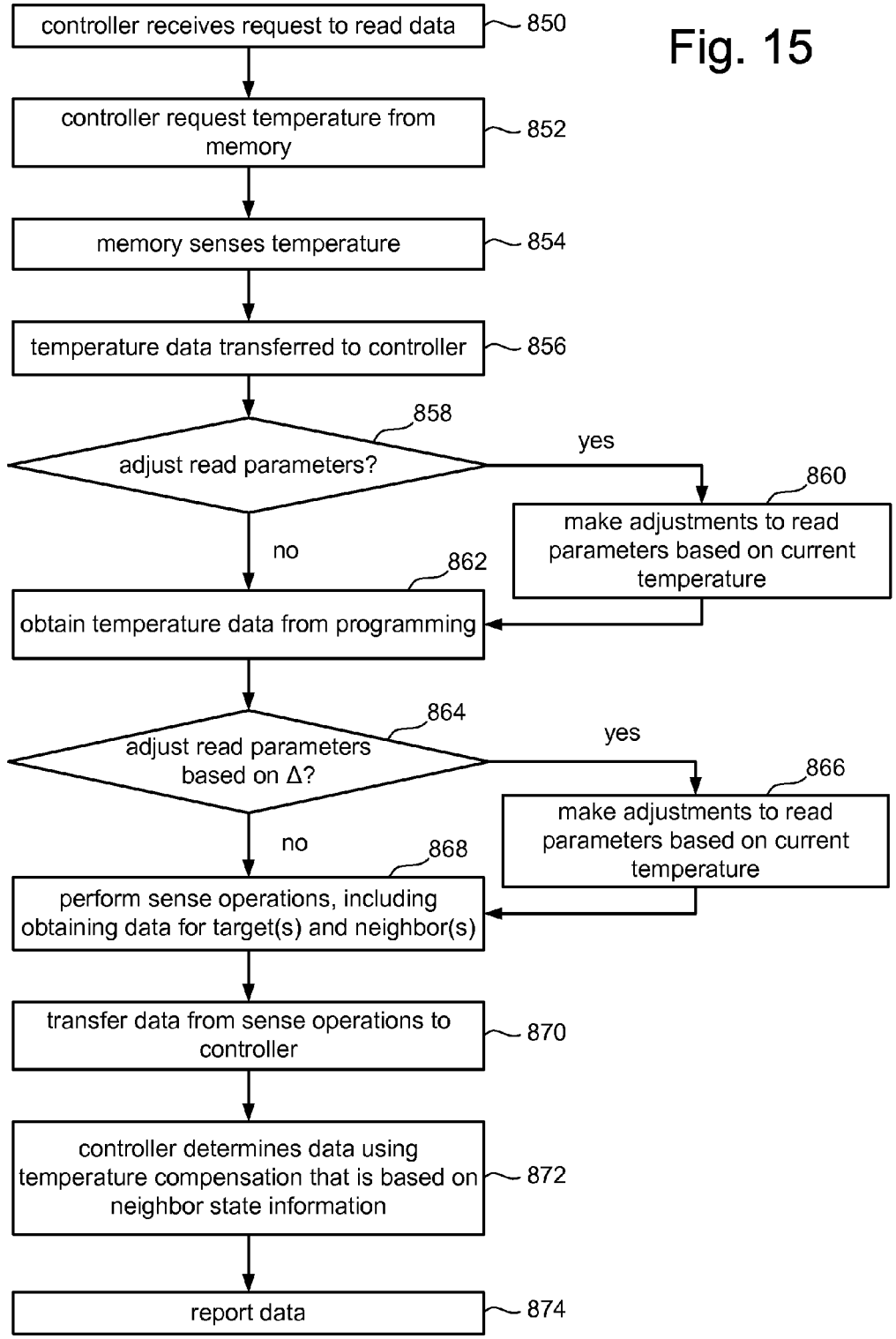
FIG. 15 is a flow chart describing one embodiment of a process for reading data from non-volatile storage.

FIG. 15 is a flow chart describing one example embodiment of the process of FIG. 14. In this example, controller 244 will make a decision to provide temperature compensation based on the temperature difference between the time of programming and the time of reading. If the controller determines that temperature compensation is necessary, the amount of compensation will be based on the data state of the neighbors of the target memory cell. In some embodiments, the temperature compensation is also based on the temperature difference between programming and reading or the current temperature. In the example discussed below with respect to FIG. 15, the temperature is sensed by temperature sensor 228 in memory chip 212, and the compensation is provided at the direction of controller 244. However, in other embodiments, the process of FIG. 15 can be used in an implementation where the temperature is not measured on the memory chip, but is measured by some other component in the memory system or another component outside the memory system, to compensate for the temperature dependent mechanisms. For example, in a system that uses a solid state disk drive (SSD) that uses flash memory or other non-volatile storage to store data, temperature may be available from the host or other component external to the SSD. The controller of the SSD could use that temperature information to compensate for the temperature effect, as disclosed herein. It does not matter where the temperature information comes from. By using the neighbor data state to provide additional temperature compensation, the memory system can account for widening and shift of threshold voltages due to differences in temperature between the time data was programmed and data was read in order to prevent and/or correct errors.

In step 850 of FIG. 15, controller 244 receives a request to read data from the host. In one embodiment step 850 is not performed and the process of FIG. 15 is performed as part of an internal reading process (e.g. for leveling, garbage collection, etc.). In step 852, controller 244 requests temperature data from temperature sensor 228. In one embodiment, controller 244 communicates this request to state machine 222 or another portion of control circuitry 220, which will obtain the temperature data from temperature sensor 228. In step 854, memory chip 212 will sense the current temperature using temperature sensor 228. In step 856, the temperature data is transferred to controller 244 from control circuitry 220. In step 858, controller 244 determines whether to adjust any of the read (or other operational) parameters based on the current temperature. If so, the adjustments to the read parameters are made in step 860 based on the current temperature.

The adjustments made in step 860 are those known in the art, such as changing read compare levels, sense currents, operation of the sense amplifier, body bias conditions, etc. Another example of an adjustment can be to perform a scan of all the memory cells on a word line (or other unit of memory cells) to obtain data that approximates the entire threshold voltage distribution for the entire population of memory cells being scanned. From those distributions, the system can identify minimum points between maximum points. Those minimum points are used to establish new read compare levels. In some embodiments, steps 852 to 860 can be performed automatically by memory 212.

After step 860, controller 244 will obtain temperature data from the time that the data being read was first programmed. In some embodiments, the temperature information during programming may be obtained as part of the sense operations of 868, if the programming temperature is for example stored in extra cells on the same word line. If in step 858 controller 244 determined not to adjust the parameters, then the process skips step 860 and proceeds directly to step 862 to obtain temperature data from the time of programming. In one embodiment, temperature sensor 228 will store the temperature data from programming and other operations in memory 200 or another nonvolatile storage device. In step 862, controller 244 can identify the data being read, and control circuitry 220 will obtain the previously stored temperature data for that associated with when the data was programmed. That temperature information is sent to controller 244 as part of step 862.

In step 864, controller 244 will adjust read (or other operational) parameters based on the change in temperature. For example, in step 856, controller 244 received the current temperature. In step 862, controller 244 receives the temperature at the time of programming. Thus, by subtracting the two temperatures (e.g., current—previous), controller 244 knows the temperature difference between the time of programming and the time of reading (assuming now is the time of reading). If that temperature difference is greater than a threshold, then controller 244 may determine to provide temperature compensation in step 866 based on the temperature (e.g., current temperature or temperature difference) The compensation provided in step 866 is temperature compensation that is not based on neighbor state data. Rather, it is traditional temperature compensation.

Note that, if in step 864, controller 244 determines not to provide the temperature compensation, then the process will skip step 866 and proceed directly to step 868. In step 868, the controller 244 will cause one or more sense operations to be performed on the target memory cells.

The read request of step 850 likely will request data from multiple memory cells; for example, all (or subset of) memory cells on a word line or all (or subset of) memory cells connected to multiple word lines. Various sensing operations are performed to obtain initial sets of data for the target memory cells. Step 868 also includes performing the sensing operations for neighbor memory cells for the target memory cells. In one embodiment, when the neighbor memory cells are those memory cells on the same word line, then performing a sense operation for all memory cells in the same word line (which obtains the data for the target memory cells), also obtains the data for the neighbor memory cells. In some cases, this set of target memory cells may also include neighbor memory cells for each of the target memory cells. In some embodiments, the data sensed in step 868 is initial data which has not been adjusted for the temperature compensation discussed below. In some embodiments, the temperature information during programming may be obtained as part of the sense operations of 868, if the programming temperature is, for example, stored in extra memory cells on the same word line.

In step 870, that initial information from the sensing operation is transferred from the memory chip 212 to controller 244. In step 872, the controller determines the final data read using temperature compensation that is based on neighbor state information and/or temperature information. More details of step 872 are provided below. In step 874, controller 244 reports the data (see step 812 of FIG. 14). Note that in the above discussion of FIG. 15, temperature compensation is performed three times: step 860, step 866 and step 872. In other embodiments, temperature compensation is only performed one time (step 872) or two times (step 872 and either step 860 or step 866).

Figures 16, 17:
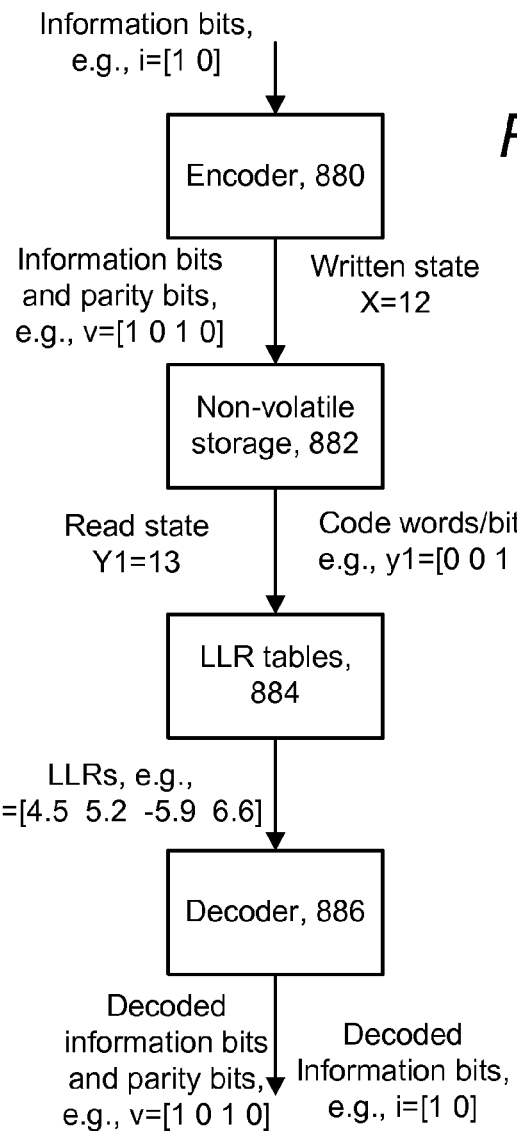
FIG. 16 is a flow chart describing one embodiment of a process for encoding and decoding data that is stored in non-volatile storage.
FIG. 17 depicts an example LRR table.

As mentioned above, the data programmed and read can have errors. To fix these errors, the system uses an ECC process that encodes the data with error correction codes during programming and decodes the data during a read process. FIG. 16 depicts a system for encoding and decoding data for non-volatile storage that can be used in accordance with one embodiment. Error correction controls are employed to detect and correct readings of erroneous or corrupted data in the non-volatile memory array. Generally speaking, some additional ECC or parity bits are calculated from the input data and stored in the memory array according to an encoding scheme. When reading, the input data and ECC bits are both read, and a decoder uses both to detect whether errors are present and in some cases, in which bit(s) the errors occur.

The error correction control system of FIG. 16 can be implemented as part of controller 244 in one embodiment, although different systems and architectures can be used. The system of FIG. 16 includes an encoder 880, non-volatile storage 882 (e.g., the memory array 200), LLR (logarithmic likelihood ratio) tables 884 and a decoder 886. The encoder 880 receives user data, also referred to as information bits, that is to be stored in non-volatile storage 882. The informational bits are represented by the matrix i=[1 0] (note that two bits are used for example purposes only, and many embodiments have code words longer than two bits). The encoder 802 implements an error correction coding process in which parity bits are added to the informational bits to provide data represented by the matrix or code word v=[1 0 1 0], indicating that two parity bits have been appended to the data bits. Other techniques, such as those discussed hereinafter, can be used that map input data to output data in more complex manners. Low density parity check (LDPC) codes, also referred to as Gallager codes, can be used. In practice, such codes are typically applied to multiple pages encoded across a number of storage elements. Further information regarding LDPCs can be found in D. MacKay, Information Theory, Inference and Learning Algorithms, Cambridge University Press 2003, chapter 47. The data bits can then be mapped to a logical page and stored in the non-volatile storage 882 by programming each non-volatile storage element in a set of non-volatile storage elements to one or more programmed states. Typically, the code words have a large number of bits and stored across many memory cells. A subset of the bits of a code word would be stored in a particular memory cell.

In one possible implementation, an iterative 'message passing' decoding process is used which implements error correction decoding employing the redundancy bits provided by the encoding implemented at the encoder 880. Further details regarding iterative message passing decoding can be found in the above-mentioned D. MacKay text. The iterative probabilistic message passing decoding attempts to decode a code word by assigning initial probability metrics to each bit in the code word. The probability metrics indicate a reliability of each bit, that is, how likely it is that the bit is not in error. In one approach, the probability metrics are logarithmic likelihood ratios LLRs which are obtained from LLR tables 884. LLR values are measures of the reliability with which the values of various binary bits read from the storage elements are known.

In one embodiment the LLR for a bit is given by $$Q = \log_2 \frac{P(v=0 \mid Y)}{P(v=1 \mid Y)},$$

where P(v=0|Y) is the probability that a bit is a 0 given the condition that the state read is Y, and P(v=1|Y) is the probability that a bit is a 1 given the condition that the state read is Y. Thus, an LLR>0 indicates a bit is more likely a 0 than a 1, while an LLR<0 indicates a bit is more likely a 1 than a 0. Further, a greater magnitude indicates a greater probability or increased reliability. Thus, a bit with an LLR=63 is more likely to be a 0 than a bit with an LLR=5, and a bit with an LLR=−63 is more likely to be a 1 than a bit with an LLR=−5. LLR=0 indicates the bit is equally likely to be a 0 or a 1.

An LLR value can be provided for each of the bit positions in a codeword. Further, the LLR tables can account for the multiple read results so that an LLR of greater magnitude is used when the bit is more likely to hold either '0' or '1' with respect to the voltage level read from the non volatile memory when taking under consideration the mapping between bit sequences and programmed states of the non volatile memory.

The decoder 886 receives the LLRs and iterates in successive iterations in which it determines if the parity checks representing the code have been satisfied. If all parity checks have been satisfied, the decoding process has converged and a code word has been reconstructed. If one or more parity checks have not been satisfied, the decoder will adjust the LLRs of one or more of the bits which are inconsistent with a parity check and then reapply the parity check or next check in the process to determine if it has been satisfied. For example, the magnitude and/or polarity of the LLRs can be adjusted. If the parity check in question is still not satisfied, the LLR can be adjusted again during another iteration. Adjusting the LLRs can result in flipping a bit (e.g., from 0 to 1 or from 1 to 0) in some, but not all, cases. In one embodiment, another parity check is applied to the code word, if applicable, once the parity check in question has been satisfied. In others, the process moves to the next parity check, looping back to the failed check at a later time. The process continues in an attempt to satisfy all parity checks. Thus, the decoding process of Y1 is completed to obtain the decoded information including parity bits v and the decoded information bits i.

FIG. 17 depicts an example LRR table having an initial LLR values for each bit position of the different states for a device storing two bits of data per memory cell, in four states (where |M3|>|M2|). The two bits stored in each memory cell are referred to as a lower bit and an upper bit. A positive LLR value indicates a logical 0 for the corresponding bit and a negative LLR indicates a logical 1 for the corresponding bit. A greater magnitude indicates a greater reliability or probability with respect to the bit being in that logical state. The LLR table of FIG. 17 is for an example set of data in the case of a uniform distribution of states over the voltage window, Gaussian noise and grey-coded data corresponding with the coding in FIG. 9.

As mentioned previously, the memory stores data which represents informational bits and parity bits (or ECC bits), where the parity bits are provided according to an error correction code. The parity bits define a codeword together with the information bits. In one possible approach, a low density parity check (LDPC) code may be used. In practice, such codes are typically applied to a large number of bits which are encoded across a number of storage elements (i.e., not every cell stores parity bits, the check being distributed across multiple cells). LDPC codes are desirable because they incur a relatively low overhead cost. Moreover, LDPC codes exhibit a performance near the Shannon limit under iterative message-passing decoding algorithms. However, this is an example implementation only, as any types of error correction code can be used as well. For example, other linear block codes may be used.

An LDPC code is a linear block code which is characterized by a sparse parity check matrix. The matrix includes K information bits and M parity bits, and the code length is N=K+M. Further, the parity bits are defined such that M parity check equations are satisfied, where each row of the matrix represents a parity check equation. In particular, the rows of the matrix are identified by check nodes and the columns are identified by variables, which indicate the data that is stored in the storage elements, e.g., the code word bits. This data includes information bits i and parity bits p, based on the equation:

$$H \cdot \overline{v} = H \cdot \left[ \frac{\overline{i}}{\overline{p}} \right] = 0,$$

where H is the sparse parity check matrix, v is the data vector, i is the information bits vector and p is the parity bits vector. The parity vector p can be determined by solving the above equation. Further, this can be done efficiently using a Gaussian elimination procedure if the right hand side of matrix H is lower triangular.

The decoding process for LDPC is an iterative probabilistic decoding process known as iterative message passing decoding. Various message passing decoding algorithms are know in the art. A common such algorithm is the belief propagation algorithm. In one embodiment the iterations involves serially traversing the check nodes and updating the LLR values of the bits involved based on each parity check. In one approach, an attempt is made to satisfy the first parity check of the parity check matrix. Once that parity check is satisfied, an attempt is made to satisfy the second parity check, and so forth. Note that once a bit's sign is flipped then a parity check which was previously satisfied can fail once the flip is done. The LLR's are modified until all checks are satisfied in a manner known to those skilled in the art. Note that the family of iterative decoding algorithms includes the group of message passing decoding algorithms which in turn includes the belief propagation decoding algorithm.

Figure 18:
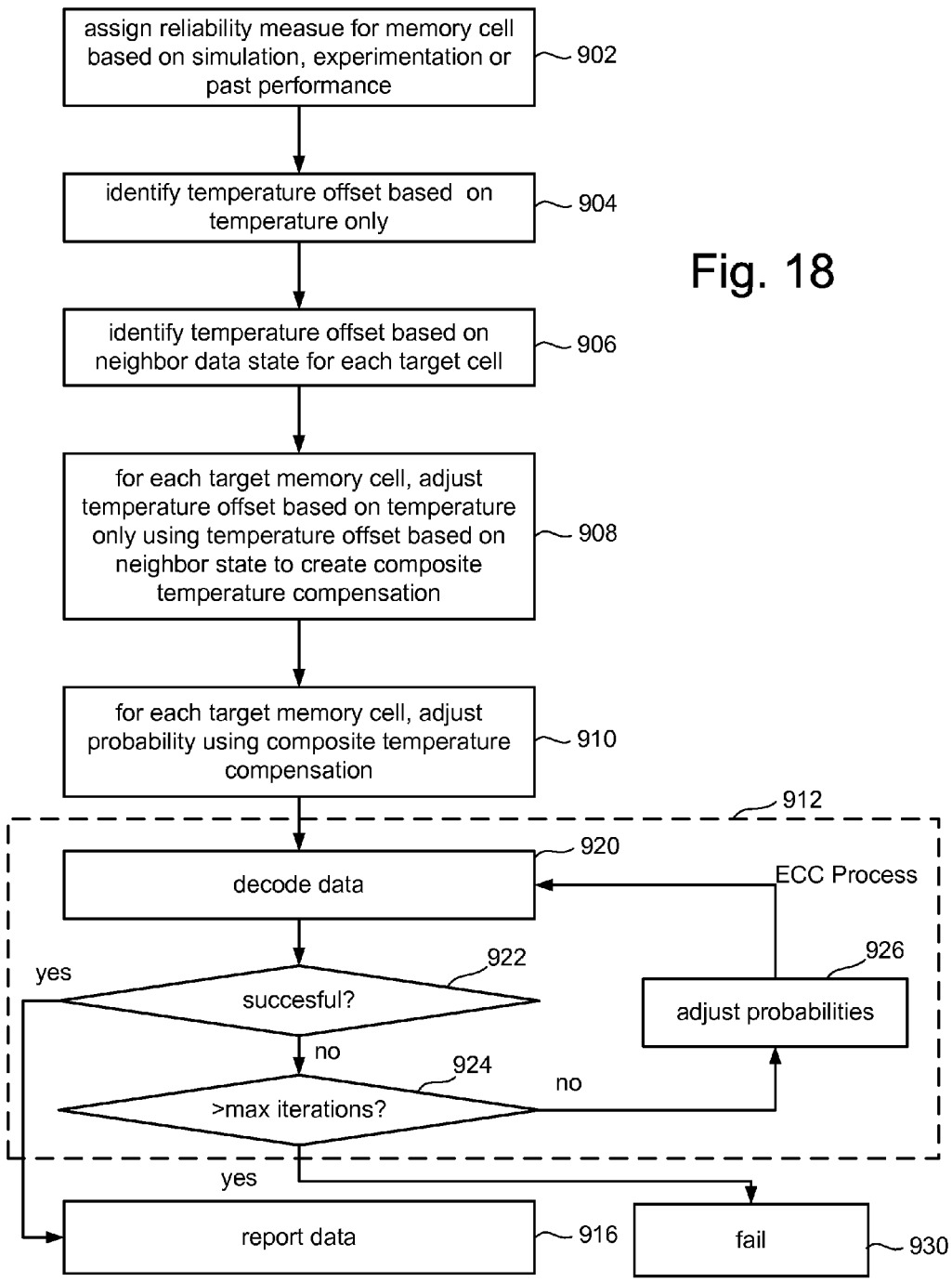
FIG. 18 is a flow chart describing one embodiment of a process for reading data from non-volatile storage.

FIG. 18 is a flow chart describing one embodiment of a process for the controller 244 to determine data using temperature compensation that is based on neighbor state information and/or temperature information (step 872 of FIG. 15). The process of FIG. 18 uses the iterative probabilistic decoding process discussed above. In step 902, controller 244 (or another entity) will assign a reliability measure (e.g., probability for a bit to be 0 or 1)) for each memory cell. If a cell represents 2, 3, or more bits, the controller assigns several reliability measures to each cell. That measure is dependent on two factors: the noise model (e.g. the probability of programming one state and reading another state) and the mapping of bits to states. In other embodiments, step 902 can also be based on simulation, experimentation, or past performance. In one example implementation, controller 244 will access the appropriate LLR table (see FIG. 17). The LRR table can be created prior to manufacturing, after post-manufacturing testing or dynamically during operation of the memory system. Based on the initial information received from the sensing operation (step 868), controller 244 will assign the appropriate reliability from the LLR table for each memory cell or for each bit read.

In step 904, controller 244 will identify a temperature offset for each memory cell. This temperature offset at step 904 is based on temperature differential only; for example, the temperature offset at step 904 can be based on the difference between the temperature at the time of programming and the temperature at the time of reading. In one embodiment, the offset is a multiplier. In another embodiment, the offset can be a constant that is added. For example, controller 244 can maintain a table that has an entry for each temperature differential value (or set of values) to indicate what the offset should be. In one implementation, the table will have a set of ranges of temperature differentials and an offset for each range. Step 904 will include using the temperature differential to identify the appropriate offset. In one embodiment, a temperature offset is provided for each memory cell. Once the memory cell's temperature offset is accounted for, the impact of the temperature compensation can be computed separately to each of the bits stored by that memory cell.

In step 906, controller 244 will identify a temperature offset based on the neighbor state for each target memory cell. As explained above, controller 244 will have the initial sense information for each memory cell including the target memory cell and neighbor memory cell for each target. In one embodiment, controller 244 will cause all memory cells connected to a word line to be read. Therefore, if every target memory cell on the word line (which in one case is all memory cells connected to the word line) the neighbor memory cells on the word line will also have their data received by the controller 244. Based on the data in one or both neighbors (or more than two neighbors if taking into account same bit line or diagonal neighbors), controller 244 can identify an offset. The offset can be a multiplier or a constant that is added, as discussed above (using tables or other data structure).

In step 908, a composite temperature compensation value is created for each memory cell (or in some embodiments, each bit). For each target memory cell (or for each bit read) the composite temperature compensation includes the temperature offset based on temperature only (step 904) adjusted by the temperature offset based on neighbor data state (step 906). For example, if the offset from step 904 is a multiplier (X1) and the offset from step 906 is a second multiplier (X2), then the composite temperature compensation can be a product of the two multipliers, which is equal to (X1)*(X2). In step 910, for each target memory cell (or each bit read), the appropriate probability value from the LLR table is adjusted based on the composite temperature compensation. For example, a multiplier is multiplied by the value from the LLR table or a constant is added to the value in the LLR table. In step 912, the ECC decoding procedure is performed (see step 886 of FIG. 16). The result of the ECC process 912 is to converge to a code word. When the probability that the identified code word is different from the programmed codeword is small then the decoder reconstructs the actual programmed data. In step 916, that data is reported by controller 244 to the host. In some embodiments, if the number of errors in the data is larger than the decoder's correction capability the decoder will fail even with if the number of iterations and probabilities adjustments is large.

FIG. 18 shows the ECC decoding process 912 including steps 920, 922, 924 and 926. In step 920, the data is decoded based on the current set of probabilities. In step 922, if the decoded data matches a legal code word, then the process is successful and the data is reported in step 916. If the decoded data from step 920 does not match the allowed code words (step 924), then the probabilities need to be adjusted in step 926 and the process loops back to step 920 to try to decode the data again. Before adjusting the probabilities, the system tests whether the loop of steps 920-926 is performed more than a maximum number of times (max). If so, the process has failed (step 930). If not, then the probabilities need to be adjusted in step 926. One embodiment of step 926 includes adjusting the magnitudes of the probabilities. Another embodiment of step 926 includes adjusting the sign of the probabilities. In yet another embodiment, the magnitude and the sign can be adjusted. There are various methods for adjusting the magnitude or signs. In one embodiment, the one or more probability values closest to zero will have their signs flipped and magnitudes changed. The process of step 912 is an iterative process using the teachings of LDCP codes discussed above and known in the art.

In the discussion above, the initial sensing of the target memory cells includes using the read compare levels Vra, Vrb and Vrc (see FIG. 6). In another embodiment, additional read compare levels can be used to sense with greater resolutions. For example, FIG. 19 shows overlapping threshold voltage distributions with read compare levels Vra, Vrb1, Vrb2, Vrb3, Vrc1, Vrc2 and Vrc3. By reading each of those read compare levels, a more accurate probability can be assigned to the various initial data set. For example, if a memory cell has a threshold voltage between Vra and Vrb1, then that memory cell has a threshold voltage in the range R1. A memory cell in range R1 has a high probability of being in state A. If the memory cell has a threshold voltage greater than Vrb1 and less than Vrb2, then the threshold voltage of that memory cell is in range R2. A memory cell with a threshold voltage in range R2 has a lower probability of being in state A and a similarly lower probability of being in state B. If a memory cell has a threshold voltage greater than Vrb2 and less than Vrb3, then the threshold voltage is in range R3. A memory cell with a threshold voltage in range R3 has a lower probability of being in state B and even a lower probability of being in state A. The probability of being in state B for memory cells in range R2 is smaller than the probability of memory cells in range R3 to be in state B. If a memory cell has a threshold voltage greater than Vrb3 and less than Vrc1, then that threshold voltage is in range R4. Memory cells that have a threshold voltage in range R4 have a high probability of being in state B. If a memory cell has a threshold voltage greater than Vrc1 and less than Vrc2, then that memory cell has a threshold voltage in range R5. A memory cell having a threshold voltage in range R5 has a lower probability of being in state B and even a lower probability of being in state C. If the memory cell has a threshold voltage greater than Vrc2 and less than Vrc3, then that threshold voltage is in range R6. A memory cell with a threshold voltage in range R6 has a lower probability of being in state C and yet even a lower probability of being in state B. If the memory cell has a threshold voltage greater than Vrc3, then that memory cell is in range R7. A memory cell with a threshold voltage in range R7 has a high probability of being in state C. Note that state E is not shown in FIG. 19. However, if the memory cell has a threshold voltage less than Vra, then it is range R0 and has a high probability of being in state E.

FIG. 20 is an LLR table indicating the reliability measures (LLR's) per bit for being in each of the threshold voltage ranges of FIG. 19. The LLR table of FIG. 20 assumes two bits are stored per memory cell. In the example LLR table of FIG. 20, the magnitudes M1 to M5 satisfy |M5|>|M4|>|M3|>|M2|>|M1|. Each of the magnitudes in the table indicates the log likelihood ratio of that bit being 0 or 1. With a negative sign indicating the LLR of the bit to be a 1 and with a positive sign indicating the LLR of that bit to be 0.

One embodiment includes the process of FIG. 15 and FIG. 18 (step 872 of FIG. 15) using the read compare levels of FIG. 19 and the LLR table of FIG. 20. When performing the sense operation (see step 868), the memory chip would perform read compare levels at Vra, Vrb1, Vrb2, Vrb3, Vrc1, Vrc2, and Vrc3 to identify which range (R0, R1 ... R7) the memory cell is in. This data is referred to as soft information. This soft information is then transmitted to controller 244. Controller 244 will then identify the initial probability in step 902 of FIG. 18 using the LLR table of FIG. 20. The values in the LLR table of FIG. 20 would then be adjusted in step 910 based on the combination of temperature information and neighbor data state information (steps 904 and 906), as explained above.

In one embodiment, each voltage range is mapped to a sequence of bits identifying it for the controller. That sequence includes more than two bits. Usually the first two bits in that sequence are the hard bits, e.g. they represent the sign of the bit in the lower page and the sign of the bit in the upper page, while the rest of the bits in the sequence are the soft bits. However, in another mapping, simply a sequence of bits representing each threshold and the information regarding the sign of each of the bits can only be found in the LLR table. When there are more than four ranges, then the identified voltage represents soft information. Hard bits and soft bits refer to the case that within the representing sequence or mapping, the system can directly identify the stored bits (SB) which are equivalent to the hard bits (HB) in the mapping while the rest of the bits in the sequence are the soft bits. It can be shown that using a gray mapping improves the capacity of the cell e.g. it results for the optimal correction capability under BICM (Bit Interleaved Code Modulation) scheme while it is sufficient that the HB are gray while the SB representation does not matter.

Another embodiment for providing temperature compensation based on neighbor data state information includes using the temperature differential ΔT between the temperature at reading and the temperature at programming to determine whether to provide neighbor data state information or not. For example, steps 904-910 of FIG. 18 are replaced by steps 980, 982 and 984 of FIG. 21. Subsequent to steps 982 or 984, the process will continue at step 912 of FIG. 18. In step 980, the system will determine whether the ΔT is greater than some threshold constant K. If ΔT is not greater than the constant K, then no compensation is provided (step 982). If, however, ΔT is greater than the constant K, then compensation is provided in step 984 based on the data state of the neighbor. U.S. Published Patent Application No. 2009/0080259, "Post-Facto Correction for Cross Coupling in a Flash Memory," published Mar. 26, 2009, disclosed a method for reading data from nonvolatile storage elements in which data stored in a memory cell is estimated based on the measurements and on respective extents to which neighbors disturb the reading of the target memory cells. Step 984 of FIG. 21 can be performed by implementing the process of published application U.S. 2009/0080259.

Figure 22:
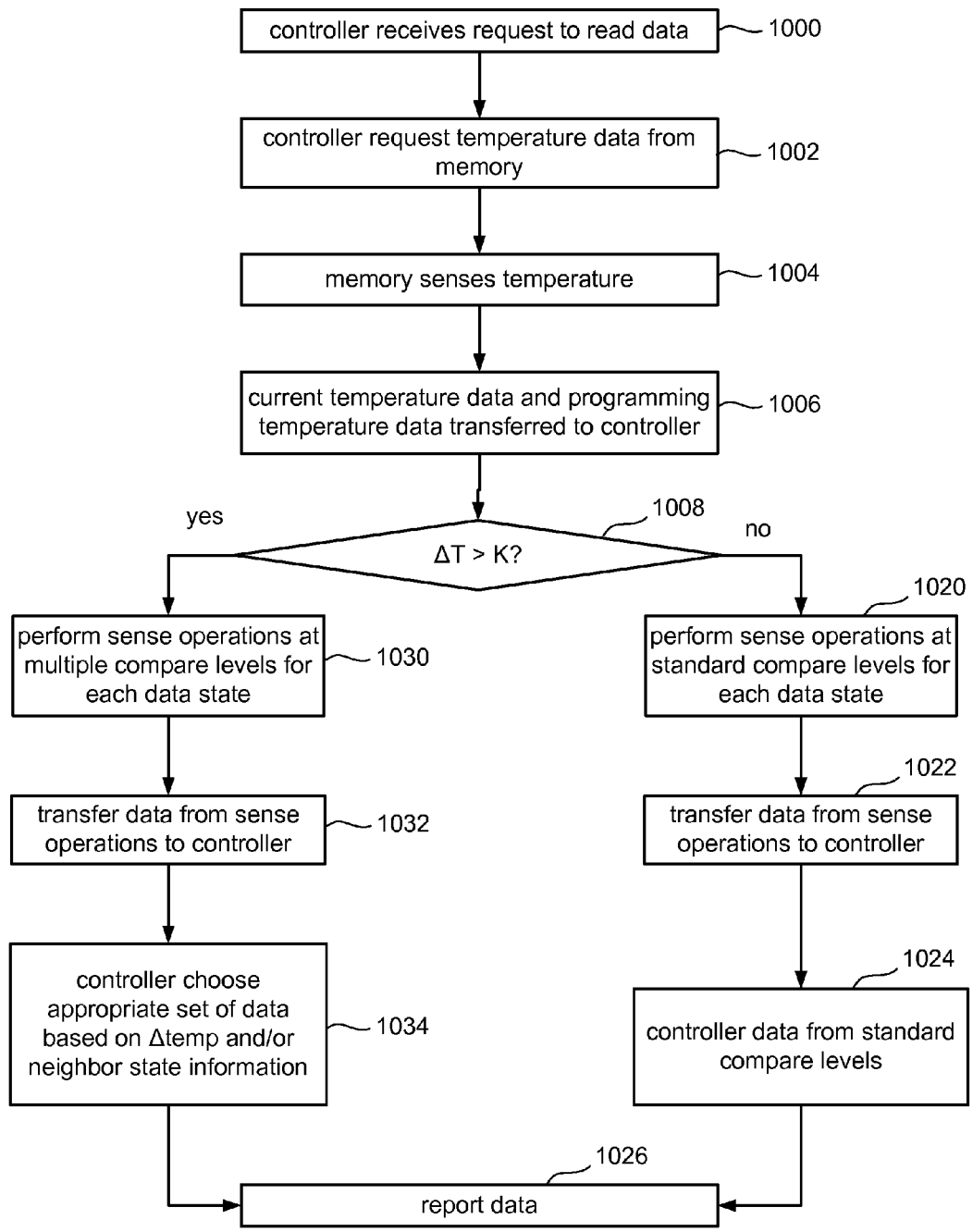
FIG. 22 is a flow chart describing one embodiment of a process for reading data from non-volatile storage.
Figure 23:
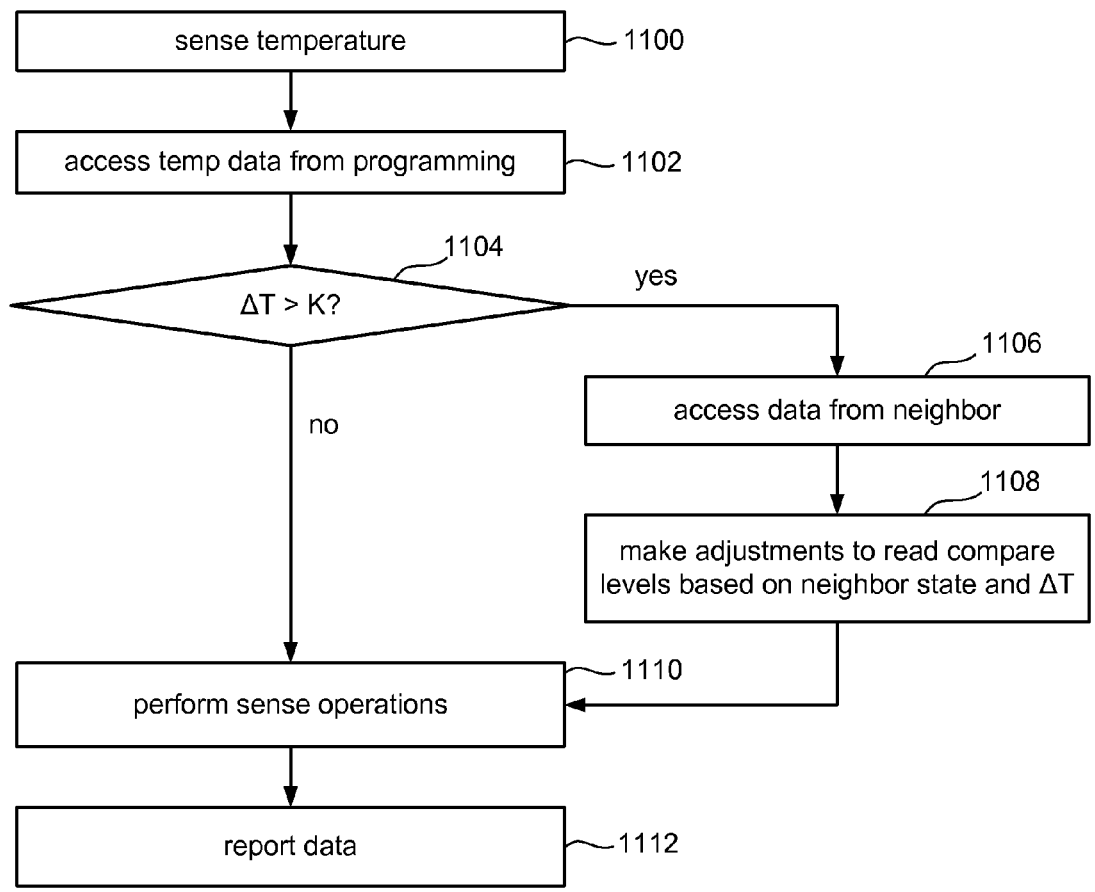
FIG. 23 is a flow chart describing one embodiment of a process for reading data from non-volatile storage.

In another set of embodiments, temperature compensation (taking into account neighbor data state) can be used to adjust read compare levels for the read process. FIGS. 22 and 23 are flow charts describing two implementations of change in the read compare values based on temperature compensation (that is adjusted based on neighbor data state). The process of FIG. 22 includes taking into account the neighbor data state for other memory cells along the same word line and provides the compensation after the step of sensing. The process of FIG. 23 can take into account neighbor data states on the same word line or the same bit line and provides the compensation before the sensing.

In step 1000 of FIG. 22, the controller receives a request to read data. In step 1002, controller 244 requests temperature data from the memory chip, as described above. In step 1004, the memory chip will sense temperature information (e.g., using temperature sensor 228), as described above. In step 1006, the current temperature data sensed in step 1004 and historic temperature data (the temperature data from the time of programming the data to be read) is transferred to controller 244. In step 1008, controller 244 determines whether ΔT (the difference between the current temperature and the temperature taken at the time that the data was programmed) is greater than some constant K. If ΔT is not greater than K, then in step 1020 a sense operation is performed at the standard compare levels (e.g., Vra, Vrb and Vrc). In step 1022, the data sensed is transferred to controller 244. In step 1024, the controller will determine the final data using any of the methods known in the art. In one embodiment, standard ECC decoding can be used. In another embodiment, an iterative ECC process can be used, as described above, or as otherwise known in the prior art. In step 1026, the data is reported to the host.

If, in step 1008, controller 244 determines that ΔT is greater than the constant K, then in step 1030 sense operations are performed at multiple compare levels for each data state. For example, the read operation can be performed at the standard compare levels and a set of one or more compare levels greater than the standard compare level and a set of one or more compare levels below the standard compare level. In one embodiment, three read operations between each pair of states can be performed at, for example, Vra, Vra+0.2v, Vra−0.2v, Vrb, Vrb+0.2v, Vrb−0.2,v Vrc, Vrc+0.2v and Vrc−0.2v. In other embodiments, more compare levels can be used and increments other than +/−0.2 can be used. In step 1032, the data is transferred to controller 244. In one embodiment, the results of each sensing operation can be transferred. In step 1034, controller 244 will choose the appropriate set of data to use for each memory cell based on a combination of temperature difference (temperature difference between temperature at the time of programming and temperature at the time of reading) and the data state of one or more of the neighbor memory cells. A function can be created that takes into account the temperature difference (temperature difference between temperature at the time of programming and temperature at the time of reading) and whether the neighbor(s) is/are in state E, A, B or C to identify which of the various read operations to use the data from. In another embodiment, a set of one or more tables can be set up with information for each combination of temperature difference (temperature difference between temperature at the time of programming and temperature at the time of reading) and the neighbor memory cells data state. After step 1034, the data is reported in step 1026. Note that the process of FIG. 22 described above is performed by controller 244. In another embodiment, the process of FIG. 22 can be performed by state machine 222. By performing the process in the state machine, the system will save time from transferring data from multiple sense operations to controller 244.

FIG. 23 is a flow chart describing another embodiment for adjusting read compare values based on temperature compensation that takes into account neighbor state information. In the process of FIG. 23, the compensation is provided prior to the sense operations. In step 1100 of FIG. 23, temperature is sensed, as described above. In step 1102, the temperature data for the time of programming is accessed. If ΔT (the difference between the current temperature and the temperature at the time of programming) is greater than a constant K, then data is accessed from the neighbor memory cells in step 1106. In one embodiment, the system can actively read the neighbor memory cells. In another embodiment, the system will have previously performed and saved the results of a sense operation for a word line of memory cells, block of memory cells, etc. In another embodiment, neighbor memory cells may have been previously read and stored for other operations. In step 1108, adjustments are made to the read compare levels based on the neighbor memory cells state and ΔT. For example, in one embodiment, there can be one offset greater than the standard read compare value and one offset lower than the standard read compare value, resulting in a total of three read compare levels between each pair of states For example, Vra, Vra+0.2v, Vra−0.2v, Vrb, Vrb+0.2v, Vrb−2,v Vrc, Vrc+0.2v and Vrc−0.2v can be used. In another embodiment, more than one offsets can be used. In another embodiment, one offset greater than the standard read compare value and one offset lower than the standard read compare value can be used while not reading at the standard read compare voltage, resulting in a total of two read compare levels between each pair of states. A function can be set up which identifies which of the multiple read compare values to use based on ΔT and the data states of one or more neighbors. Alternatively, a set of tables can be set up to choose which of the read compare values based on the combination of ΔT and data state of one or more neighbors. In step 1110, sense operations are performed using the new read compare values. In one embodiment, different memory cells will utilize different read compare levels. Therefore, multiple sense operations will be performed for each state at all the compare levels necessary for the different memory cells. However, for any one memory cell, data will only be stored for the associated read compare level identified in step 1108. In step 1112, the data is reported to the host or controller or other entities. Note that in step 1104, if ΔT was not determined to be greater than the constant K, the process skips steps 1106 and 1108 and proceeds directly to step 1110 to perform the sense operations at the original compare values.

Note that a neighbor's state information can be used to adjust other compensations in addition to temperature difference compensation. For example, neighboring cell dependent threshold voltage shifts due to floating gates or floating gate coupling, programming cell data dependent program disturb, as well as other mechanisms, can also be adjusted based on the state of one or more neighbor memory cells.

In the above embodiments, when the system senses a certain difference in temperature between the temperature at the time of programming and the temperature at the time of reading, then the system will apply extra compensation that takes into account temperature difference and the data states of one or more neighbor memory cells. In another set of embodiments, the system will first attempt to perform read processes without applying extra compensation that takes into account temperature difference and the data states of one or more neighbor memory cells. Such a read process may include the use of ECC (e.g., BCH or LDPC based), with or without soft bits. If the ECC process fails (or the read process otherwise fails), then the system will operate in recovery mode. In recovery mode, the system will perform the read process again using the techniques described above to apply extra compensation that takes into account temperature difference and the data states of one or more neighbor memory cells.

One embodiment includes programming data into a set of non-volatile storage elements and reading the data from the set of non-volatile storage elements after the programming. The reading of the data includes providing temperature compensation based on temperature information and state information for at least one neighbor non-volatile storage element.

One embodiment includes determining current temperature information, accessing temperature information from programming data into a target non-volatile storage element, determining a temperature differential between the current temperature information and the temperature information from programming data, determining state information for one or more neighbor non-volatile storage elements of the target non-volatile storage element, determining and applying an amount of temperature compensation for the target non-volatile storage element based on temperature data and the state information for the one or more neighbor non-volatile storage elements if the temperature differential is greater than a threshold, sensing information from the target non-volatile storage element, and reporting data based on the sensing and the applied temperature compensation. The temperature data can include current temperature, temperature differential, or other temperature data.

One embodiment includes receiving current temperature information for a set of non-volatile storage elements, receiving programming temperature information for the set of non-volatile storage elements corresponding to a temperature during a previous programming of the set of non-volatile storage elements, adjusting operation parameters based on at least the current temperature information, sensing initial information from the set of non-volatile storage elements using the operation parameters, identifying data stored in the set of non-volatile storage elements from the initial information using temperature compensation that is based on information representing states of one or more neighbors for each of the set of non-volatile storage elements and a temperature differential between the current temperature information and the programming temperature information, and reporting the identified data.

One embodiment includes a set of non-volatile storage elements and one or more managing circuits in communication with the set of non-volatile storage elements. The one or more managing circuits read data from the set of non-volatile storage elements by providing temperature compensation based on temperature information and state information for at least one neighbor non-volatile storage element.

One embodiment includes a host interface, a memory circuit and a controller circuit. The memory circuit includes a plurality of non-volatile storage elements, decoders, a temperature sensor and a state machine. The controller circuit is in communication with the memory circuit and the host interface. The controller circuit is in communication with the state machine. From the memory circuit the controller circuit receives current temperature information from the temperature sensor and temperature information from programming the non-volatile storage elements. From the memory circuit the controller receives initial information sensed from the non-volatile storage elements. The controller determines temperature compensation based on state information for at least one neighbor non-volatile storage element and a temperature differential between the current temperature information and the temperature information from programming the non-volatile storage elements. The controller performs a data recovery process using the initial information in combination with temperature compensation to identify user data stored in the non-volatile storage elements.

One embodiment includes into a set of non-volatile storage elements, means for programming data into the set of non-volatile storage elements, and means for reading the data from the set of non-volatile storage elements after the programming. The reading of the data includes providing temperature compensation based on temperature information and neighbor state information.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A method for operating non-volatile storage, comprising:
providing temperature compensation for a set of non-volatile storage elements based on state information of at least one neighbor non-volatile storage element, wherein the providing temperature compensation based on state information of at least one neighbor non-volatile storage element comprises applying temperature compensation for the non-volatile storage elements based on state information of at least one neighbor non-volatile storage element if a current temperature differs from a temperature at a time of programming the non-volatile storage elements by a threshold.

2. The method of claim 1, wherein the providing temperature compensation based on state information of at least one neighbor non-volatile storage element comprises:
adjusting read compare levels for reading data from the non-volatile storage elements based on state information of at least one neighbor non-volatile storage element.

3. The method of claim 1, further comprising:
sensing information from the set of non-volatile storage elements; and
identifying data stored in the set of non-volatile storage elements based on the sensed information and the temperature compensation.

4. The method of claim 3, wherein the identifying data comprises:
performing an error correction code decoding process based on state information for at least one neighbor non-volatile storage element;
performing read operations at multiple read compare levels for each data state; and
determining a probability for each data bit stored in the set of non-volatile storage elements based on state information of at least one neighbor non-volatile storage element.

5. The method of claim 1, wherein the providing temperature compensation based on state information of at least one neighbor non-volatile storage element comprises:
determining an amount of temperature compensation based on state information of at least one neighbor non-volatile storage element; and
applying the amount of temperature compensation to a read process.

6. The method of claim 5, wherein the determining an amount of temperature compensation based on state information of at least one neighbor non-volatile storage element comprises:
determining an initial temperature compensation value based on temperature information; and
adjusting the initial temperature compensation value based on state information for at least one neighbor non-volatile storage element.

7. A method for operating non-volatile storage, comprising:
applying temperature compensation for a target non-volatile storage element based on a temperature differential and state information of one or more neighbor non-volatile storage elements of the target non-volatile storage element, the applying temperature compensation based on a temperature differential and state information of one or more neighbor non-volatile storage elements includes applying temperature compensation based on state information of one or more neighbor non-volatile storage elements of the target non-volatile storage element if the temperature differential is greater than a threshold.

8. A method for operating non-volatile storage, comprising:
applying temperature compensation for a target non-volatile storage element based on a temperature differential and state information of one or more neighbor non-volatile storage elements of the target non-volatile storage element, wherein the applying temperature compensation for the target non-volatile storage element comprises performing an error correction decoding process based on the state information for the one or more neighbor non-volatile storage elements.

9. A non-volatile storage system, comprising:
a set of non-volatile storage elements; and
one or more managing circuits in communication with the set of non-volatile storage elements, the one or more managing circuits provide temperature compensation for the set of non-volatile storage elements based on state information for at least one neighbor non-volatile storage element by applying temperature compensation for the non-volatile storage elements based on state information of at least one neighbor non-volatile storage element if a current temperature differs from a temperature at a time of programming the non-volatile storage elements by a threshold.

10. A non-volatile storage system, comprising:
a set of non-volatile storage elements; and
one or more managing circuits in communication with the set of non-volatile storage elements, the one or more managing circuits provide temperature compensation for the set of non-volatile storage elements based on state information for at least one neighbor non-volatile storage element by performing an error correction code decoding process based on state information for at least one neighbor non-volatile storage element.

* * * * *